United States Patent
Nguyen et al.

(10) Patent No.: US 11,728,759 B2
(45) Date of Patent: Aug. 15, 2023

(54) PHOTOVOLTAIC MODULES FOR COMMERCIAL ROOFING

(71) Applicant: GAF Energy LLC, Parsippany, NJ (US)

(72) Inventors: Thierry Nguyen, San Francisco, CA (US); Gabriela Bunea, San Jose, CA (US); Gary Rossi, San Francisco, CA (US); Nicholas Boitnott, San Francisco, CA (US); Richard Perkins, San Jose, CA (US); David Kavulak, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/900,604

(22) Filed: Aug. 31, 2022

(65) Prior Publication Data

US 2023/0076117 A1    Mar. 9, 2023

Related U.S. Application Data

(60) Provisional application No. 63/239,772, filed on Sep. 1, 2021.

(51) Int. Cl.
| | |
|---|---|
| *H02S 20/23* | (2014.01) |
| *H02S 30/10* | (2014.01) |

(Continued)

(52) U.S. Cl.
CPC ............... *H02S 20/23* (2014.12); *E04D 1/22* (2013.01); *H01L 31/0481* (2013.01); *H02S 30/10* (2014.12)

(58) Field of Classification Search
CPC .. E04D 1/20; E04D 1/265; E04D 1/30; E04D 1/26; E04D 1/22; H02S 20/25; H02S 20/23; H02S 30/10; H01L 31/0481
See application file for complete search history.

(56) References Cited

U.S. PATENT DOCUMENTS

| | | | |
|---|---|---|---|
| 1,981,467 A | 11/1934 | Radtke | |
| 3,156,497 A | 11/1964 | Lessard | |

(Continued)

FOREIGN PATENT DOCUMENTS

| | | | |
|---|---|---|---|
| CA | 2829440 A | 5/2019 | |
| CH | 700095 A2 | 6/2010 | |

(Continued)

OTHER PUBLICATIONS

Sunflare, Prockucts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Beth A Stephan
(74) *Attorney, Agent, or Firm* — Greenberg Traurig, LLP

(57) ABSTRACT

A system includes a roof deck having a slope of 0.25 inch to 3 inches per foot and a roofing membrane is composed of a first material, and at least one photovoltaic module installed on the roof deck. The photovoltaic module includes at least one solar cell, an encapsulant, a frontsheet, and a backsheet. The backsheet includes a head flap located at a first end of the backsheet, and a bottom flap located at a second end of the backsheet. The backsheet is composed of the first material. At least a first portion of the head flap is attached to the roofing membrane, and at least a second portion of the bottom flap is attached to the roofing membrane.

20 Claims, 12 Drawing Sheets

(51) Int. Cl.
*H01L 31/048* (2014.01)
*E04D 1/22* (2006.01)

(56) References Cited

U.S. PATENT DOCUMENTS

| | | | |
|---|---|---|---|
| 4,258,948 A | 3/1981 | Hoffmann | |
| 4,349,220 A | 9/1982 | Carroll et al. | |
| 4,499,702 A | 2/1985 | Turner | |
| 4,636,577 A | 1/1987 | Peterpaul | |
| 5,092,939 A * | 3/1992 | Nath | H02S 20/23 52/173.3 |
| 5,167,579 A | 12/1992 | Rotter | |
| 5,590,495 A | 1/1997 | Bressler et al. | |
| 5,642,596 A | 7/1997 | Waddington | |
| 6,008,450 A | 12/1999 | Ohtsuka et al. | |
| 6,046,399 A | 4/2000 | Kapner | |
| 6,320,114 B1 | 11/2001 | Kuechler | |
| 6,336,304 B1 | 1/2002 | Mimura et al. | |
| 6,341,454 B1 | 1/2002 | Koleoglou | |
| 6,407,329 B1 | 6/2002 | Iino et al. | |
| 6,576,830 B2 | 6/2003 | Nagao et al. | |
| 6,928,781 B2 | 8/2005 | Desbois et al. | |
| 6,972,367 B2 | 12/2005 | Federspiel et al. | |
| 7,138,578 B2 | 11/2006 | Komamine | |
| 7,155,870 B2 | 1/2007 | Almy | |
| 7,178,295 B2 | 2/2007 | Dinwoodie | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Podirsky | |
| 7,832,176 B2 | 11/2010 | McCaskill et al. | |
| 8,118,109 B1 | 2/2012 | Hacker | |
| 8,168,880 B2 | 5/2012 | Jacobs et al. | |
| 8,173,889 B2 | 5/2012 | Kalkanoglu et al. | |
| 8,210,570 B1 | 7/2012 | Railkar et al. | |
| 8,276,329 B2 | 10/2012 | Lenox | |
| 8,312,693 B2 | 11/2012 | Cappelli | |
| 8,319,093 B2 | 11/2012 | Kalkanoglu et al. | |
| 8,333,040 B2 | 12/2012 | Shiao et al. | |
| 8,371,076 B2 | 2/2013 | Jones et al. | |
| 8,375,653 B2 | 2/2013 | Shiao et al. | |
| 8,404,967 B2 | 3/2013 | Kalkanoglu et al. | |
| 8,410,349 B2 | 4/2013 | Kalkanoglu et al. | |
| 8,418,415 B2 | 4/2013 | Shiao et al. | |
| 8,438,796 B2 | 5/2013 | Shiao et al. | |
| 8,468,754 B2 | 6/2013 | Railkar et al. | |
| 8,468,757 B2 | 6/2013 | Krause et al. | |
| 8,505,249 B2 | 8/2013 | Geary | |
| 8,512,866 B2 | 8/2013 | Taylor | |
| 8,513,517 B2 | 8/2013 | Kalkanoglu et al. | |
| 8,586,856 B2 | 11/2013 | Kalkanoglu et al. | |
| 8,601,754 B2 | 12/2013 | Jenkins et al. | |
| 8,629,578 B2 | 1/2014 | Kurs et al. | |
| 8,646,228 B2 | 2/2014 | Jenkins | |
| 8,656,657 B2 | 2/2014 | Livsey et al. | |
| 8,671,630 B2 | 3/2014 | Lena et al. | |
| 8,677,702 B2 | 3/2014 | Jenkins | |
| 8,695,289 B2 | 4/2014 | Koch et al. | |
| 8,713,858 B1 | 5/2014 | Xie | |
| 8,713,860 B2 | 5/2014 | Railkar et al. | |
| 8,733,038 B2 | 5/2014 | Kalkanoglu et al. | |
| 8,789,321 B2 | 7/2014 | Ishida | |
| 8,793,940 B2 | 8/2014 | Kalkanoglu et al. | |
| 8,793,941 B2 | 8/2014 | Bosler et al. | |
| 8,826,607 B2 | 9/2014 | Shiao et al. | |
| 8,835,751 B2 | 9/2014 | Kalkanoglu et al. | |
| 8,863,451 B2 | 10/2014 | Jenkins et al. | |
| 8,898,970 B2 | 12/2014 | Jenkins et al. | |
| 8,925,262 B2 | 1/2015 | Railkar et al. | |
| 8,943,766 B2 | 2/2015 | Gombarick et al. | |
| 8,946,544 B2 | 2/2015 | Jabos et al. | |
| 8,950,128 B2 | 2/2015 | Kalkanoglu et al. | |
| 8,959,848 B2 | 2/2015 | Jenkins et al. | |
| 8,966,838 B2 | 3/2015 | Jenkins | |
| 8,966,850 B2 | 3/2015 | Jenkins et al. | |
| 8,994,224 B2 | 3/2015 | Mehta et al. | |
| 9,032,672 B2 | 5/2015 | Livsey et al. | |
| 9,166,087 B2 | 10/2015 | Chihlas et al. | |
| 9,169,646 B2 | 10/2015 | Rodrigues et al. | |
| 9,170,034 B2 | 10/2015 | Bosler et al. | |
| 9,178,465 B2 | 11/2015 | Shiao et al. | |
| 9,202,955 B2 | 12/2015 | Livsey et al. | |
| 9,212,832 B2 | 12/2015 | Jenkins | |
| 9,217,584 B2 | 12/2015 | Kalkanoglu et al. | |
| 9,270,221 B2 | 2/2016 | Zhao | |
| 9,273,885 B2 | 3/2016 | Rordigues et al. | |
| 9,276,141 B2 | 3/2016 | Kalkanoglu et al. | |
| 9,331,224 B2 | 5/2016 | Koch et al. | |
| 9,356,174 B2 | 5/2016 | Duarte et al. | |
| 9,359,014 B1 | 6/2016 | Yang et al. | |
| 9,528,270 B2 | 12/2016 | Jenkins et al. | |
| 9,605,432 B1 | 3/2017 | Robbins | |
| 9,711,672 B2 | 7/2017 | Wang | |
| 9,755,573 B2 | 9/2017 | Livsey et al. | |
| 9,786,802 B2 | 10/2017 | Shiao et al. | |
| 9,831,818 B2 | 11/2017 | West | |
| 9,912,284 B2 | 3/2018 | Svec | |
| 9,923,515 B2 | 3/2018 | Rodrigues et al. | |
| 9,938,729 B2 | 4/2018 | Coon | |
| 9,991,412 B2 | 6/2018 | Gonzalez et al. | |
| 9,998,067 B2 | 6/2018 | Kalkanoglu et al. | |
| 10,027,273 B2 | 7/2018 | West et al. | |
| 10,115,850 B2 | 10/2018 | Rodrigues et al. | |
| 10,128,660 B1 | 11/2018 | Apte et al. | |
| 10,187,005 B2 | 1/2019 | Rodrigues et al. | |
| 10,256,765 B2 | 4/2019 | Rodrigues et al. | |
| 10,454,408 B2 | 10/2019 | Livsey et al. | |
| 10,530,292 B1 | 1/2020 | Cropper et al. | |
| 10,560,048 B2 | 2/2020 | Fisher et al. | |
| 10,563,406 B2 | 2/2020 | Kalkanoglu et al. | |
| D879,031 S | 3/2020 | Lance et al. | |
| 10,784,813 B2 | 9/2020 | Kalkanoglu et al. | |
| D904,289 S | 12/2020 | Lance et al. | |
| 11,012,026 B2 | 5/2021 | Kalkanoglu et al. | |
| 11,177,639 B1 | 11/2021 | Nguyen et al. | |
| 11,217,715 B2 | 1/2022 | Sharenko et al. | |
| 11,251,744 B1 * | 2/2022 | Bunea | E04D 1/28 |
| 11,258,399 B2 | 2/2022 | Kalkanoglu et al. | |
| 11,283,394 B2 | 3/2022 | Perkins et al. | |
| 11,496,087 B2 * | 11/2022 | Rodrigues | H02S 20/25 |
| 11,508,861 B1 * | 11/2022 | Perkins | H02S 40/20 |
| 11,527,665 B2 * | 12/2022 | Boitnott | H01L 31/0488 |
| 11,545,928 B2 * | 1/2023 | Perkins | E04D 1/265 |
| 2002/0053360 A1 | 5/2002 | Kinoshita et al. | |
| 2002/0129849 A1 | 9/2002 | Heckeroth | |
| 2003/0101662 A1 | 6/2003 | Ullman | |
| 2003/0132265 A1 | 7/2003 | Villela et al. | |
| 2003/0217768 A1 | 11/2003 | Guha | |
| 2004/0173255 A1 * | 9/2004 | Heckeroth | H01L 31/048 136/251 |
| 2005/0115603 A1 | 6/2005 | Yoshida et al. | |
| 2005/0144870 A1 | 7/2005 | Dinwoodie | |
| 2006/0042683 A1 | 3/2006 | Gangemi | |
| 2007/0181174 A1 | 8/2007 | Ressler | |
| 2007/0193618 A1 | 8/2007 | Bressler et al. | |
| 2007/0249194 A1 | 10/2007 | Liao | |
| 2008/0006323 A1 | 1/2008 | Kalkanoglu et al. | |
| 2008/0035140 A1 | 2/2008 | Placer et al. | |
| 2008/0315061 A1 | 2/2008 | Placer et al. | |
| 2008/0271774 A1 | 11/2008 | Kalkanoglu et al. | |
| 2009/0000222 A1 | 1/2009 | Kalkanoglu et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0133340 A1 | 5/2009 | Shiao et al. | |
| 2009/0159118 A1 | 6/2009 | Kalkanoglu et al. | |
| 2009/0178350 A1 | 7/2009 | Kalkanoglu et al. | |
| 2009/0229652 A1 | 9/2009 | Mapel et al. | |
| 2010/0019580 A1 | 1/2010 | Croft et al. | |
| 2010/0101634 A1 | 4/2010 | Frank et al. | |
| 2010/0139184 A1 | 6/2010 | Williams et al. | |

(56) References Cited

U.S. PATENT DOCUMENTS

| | | |
|---|---|---|
| 2010/0146878 A1 | 6/2010 | Koch et al. |
| 2010/0159221 A1 | 6/2010 | Kourtakis et al. |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0197955 A1* | 8/2011 | Booth ............... H01L 31/048 136/251 |
| 2011/0239555 A1 | 10/2011 | Cook et al. |
| 2011/0277806 A1* | 11/2011 | Gillenwater ........... H02S 20/23 136/244 |
| 2011/0302859 A1 | 12/2011 | Crasnianski |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0254776 A1 | 9/2014 | O'Connor et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179726 A1 | 6/2017 | Garrity et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0305717 A1 | 10/2019 | Allen et al. |
| 2020/0020819 A1* | 1/2020 | Farhangi ............... H01L 31/046 |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0257961 A1 | 8/2021 | Perkins et al. |

FOREIGN PATENT DOCUMENTS

| | | |
|---|---|---|
| CN | 202797032 U | 3/2013 |
| DE | 1958248 A1 | 11/1971 |
| EP | 1837162 A1 | 9/2007 |
| EP | 1774372 A1 | 7/2011 |
| EP | 2784241 A1 | 10/2014 |
| JP | 2001-098703 A | 10/2002 |
| JP | 2012182322 A * | 9/2012 |
| JP | 2014003064 A * | 1/2014 |
| JP | 2017-027735 A | 2/2017 |
| WO | 2011/049944 A1 | 4/2011 |
| WO | 2015/133632 A1 | 9/2015 |
| WO | 2019/201416 A1 | 10/2019 |
| WO | WO-2023034432 A1 * | 3/2023 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

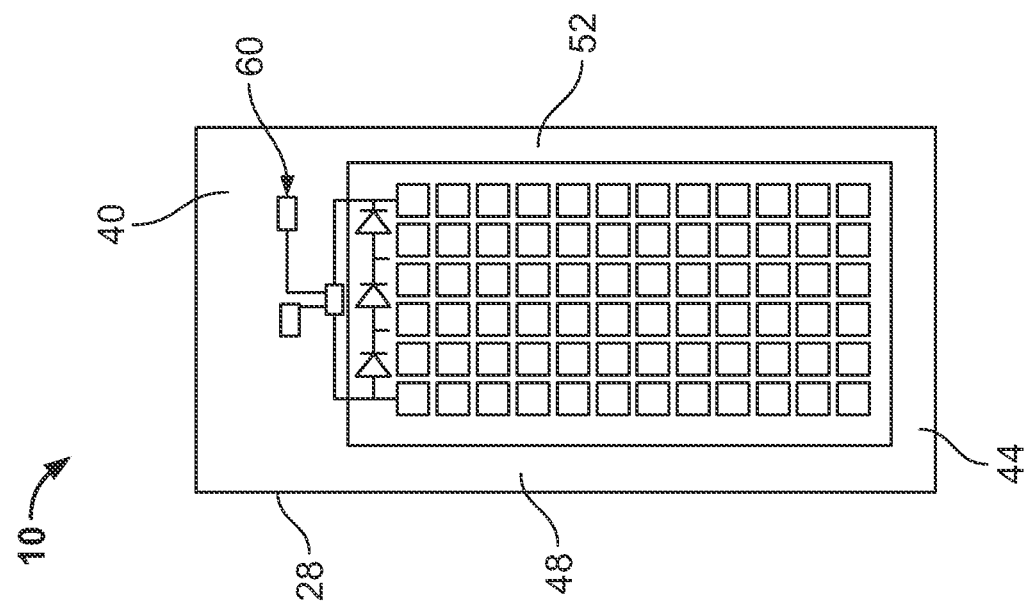
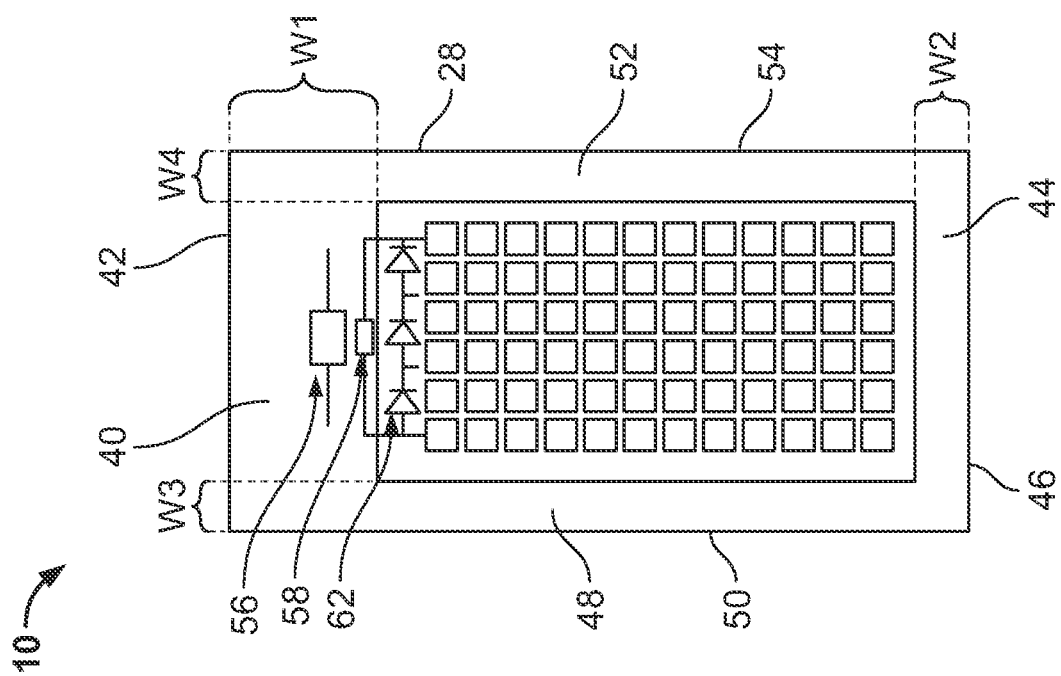

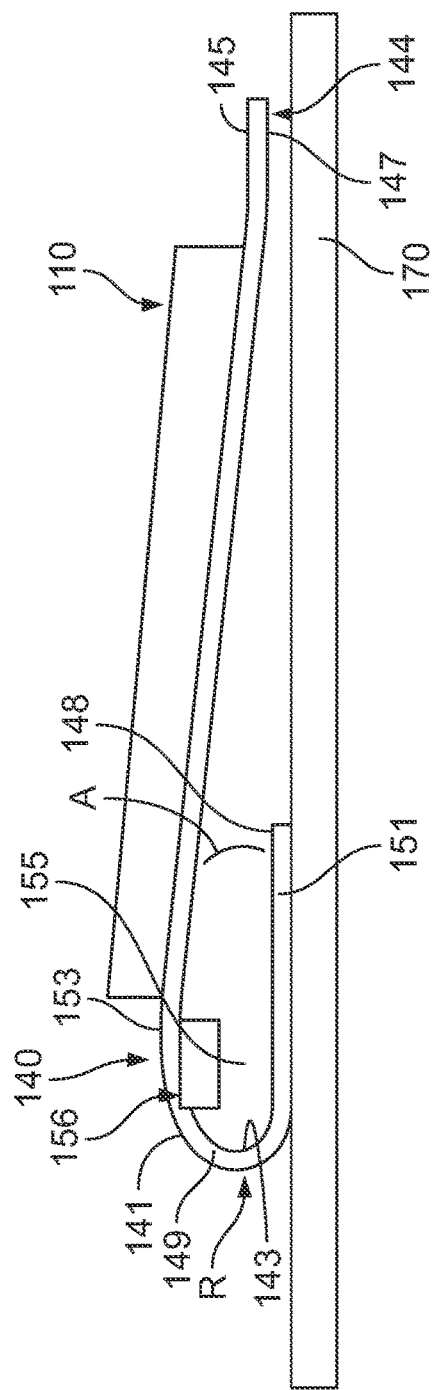
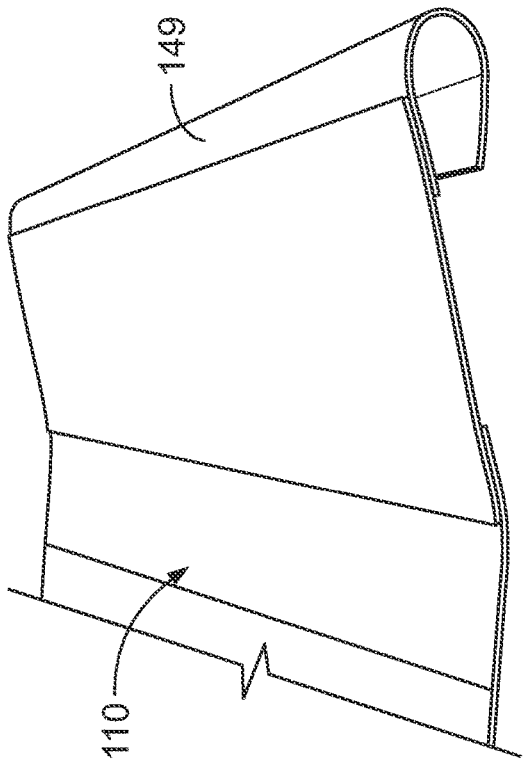
FIG. 5A
FIG. 5B

PHOTOVOLTAIC MODULES FOR COMMERCIAL ROOFING

CROSS-REFERENCE TO RELATED APPLICATION

This application is a Section 111(a) application relating to and claiming the benefit of commonly-owned, U.S. Provisional Patent Application Ser. No. 63/239,772, filed Sep. 1, 2021, entitled "PHOTOVOLTAIC MODULES FOR COMMERCIAL ROOFING," the contents of which is incorporated herein by reference in its entirety.

FIELD OF THE INVENTION

The present invention relates to photovoltaic modules, and, more particularly, photovoltaic modules for commercial roofing.

BACKGROUND

Photovoltaic systems having solar panels are commonly installed on roofing of structures. What is needed are photovoltaic modules that are configured to be installed on commercial roofing systems.

SUMMARY

In some embodiments, a system includes a roof deck, wherein the roof deck includes a slope of 0.25 inch to 3 inches per foot, wherein the roof deck includes a roofing membrane, and wherein the roofing membrane is composed of a first material; and at least one photovoltaic module installed on the roof deck, the photovoltaic module including at least one solar cell an encapsulant encapsulating the at least one solar cell, wherein the encapsulant includes a first surface and a second surface opposite the first surface, a frontsheet juxtaposed with the first surface of the encapsulant, and a backsheet juxtaposed with the second surface of the encapsulant, wherein the backsheet includes a head flap located at a first end of the backsheet, and a bottom flap located at a second end of the backsheet opposite the first end, wherein the backsheet is composed of the first material, wherein at least a first portion of the head flap is attached to the roofing membrane, and wherein at least a second portion of the bottom flap is attached to the roofing membrane.

In some embodiments, the first material is composed of a polymeric material. In some embodiments, the first material is composed of thermoplastic polyolefin (TPO). In some embodiments, the head flap and the bottom flap are attached to the roofing membrane by an adhesive. In some embodiments, the head flap and the bottom flap are attached to the roofing membrane by thermal bonding. In some embodiments, the head flap and the bottom flap are attached to the roofing membrane by ultrasonic welding. In some embodiments, the backsheet includes a first side flap located at a first side of the photovoltaic module and a second side flap located at a second side of the photovoltaic module opposite the first side, wherein at least a third portion of the first side flap is attached to the roofing membrane and at least a fourth portion of the second side flap is attached to the roofing membrane.

In some embodiments, the backsheet includes a first surface and a second surface opposite the first surface of the backsheet, and wherein the first surface of the backsheet is juxtaposed with the second surface of the encapsulant. In some embodiments, the second surface of the second portion of the bottom flap is attached to the roofing membrane. In some embodiments, the second surface of the first portion of the head flap is attached to the roofing membrane. In some embodiments, the first surface of the first portion of the head flap is attached to the roofing membrane. In some embodiments, the head flap includes a free end, wherein the free end of the head flap is folded relative to itself and forms a rounded end. In some embodiments, the rounded end includes a first portion juxtaposed with the roofing membrane and a second portion relative to the roofing membrane, wherein the second portion of the rounded end is elevated relative to the roofing membrane. In some embodiments, the first surface of at least the first portion of the rounded end is attached to the roofing membrane. In some embodiments, the second portion of the rounded end is sloped 0.1 degrees to 15 degrees.

In some embodiments, the system further includes at least one support member located intermediate a corresponding one of the at least one photovoltaic module and the roofing membrane, and wherein a portion of the at least one photovoltaic module is elevated relative to the roofing membrane. In some embodiments, the at least one solar cell includes a first plurality of solar cells arranged in a first array, and a second plurality of solar cells arranged in a second array, wherein the at least one photovoltaic module includes a first section, a second section, and a region located intermediate the first section and the second section, wherein the first array is located within the first section, wherein the second array is located within the second section, wherein the at least one support member is juxtaposed with the region.

In some embodiments, the at least one support member includes a rod. In some embodiments, the at least one support member is composed of thermoplastic polyolefin (TPO). In some embodiments, each of the first section and the second section is elevated relative to the roofing membrane, wherein the first section is sloped 0.1 degrees to 15 degrees, and wherein the second section is sloped 0.1 degrees to 15 degrees.

BRIEF DESCRIPTION OF THE DRAWINGS

FIG. 3 is a top plan view the photovoltaic module shown in FIG. 2B;

FIG. 4 is a top plan view of the photovoltaic module shown in FIG. 3, but including an electrical connector;

FIGS. 5A and 5B illustrate some embodiments of a photovoltaic module;

DETAILED DESCRIPTION

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1A:
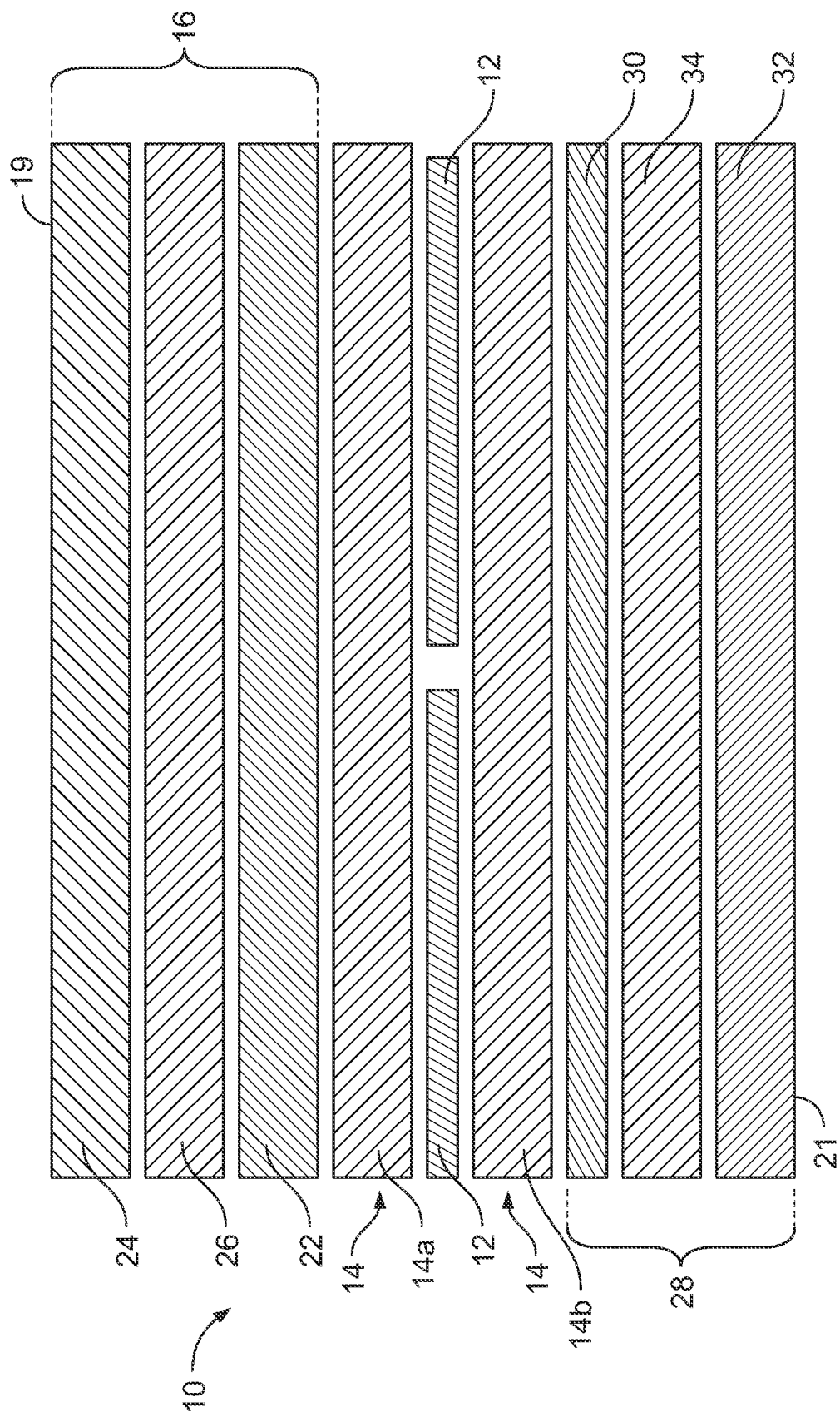
FIGS. 1A and 1B are schematic views of some embodiments of a photovoltaic module.
Figure 1B:
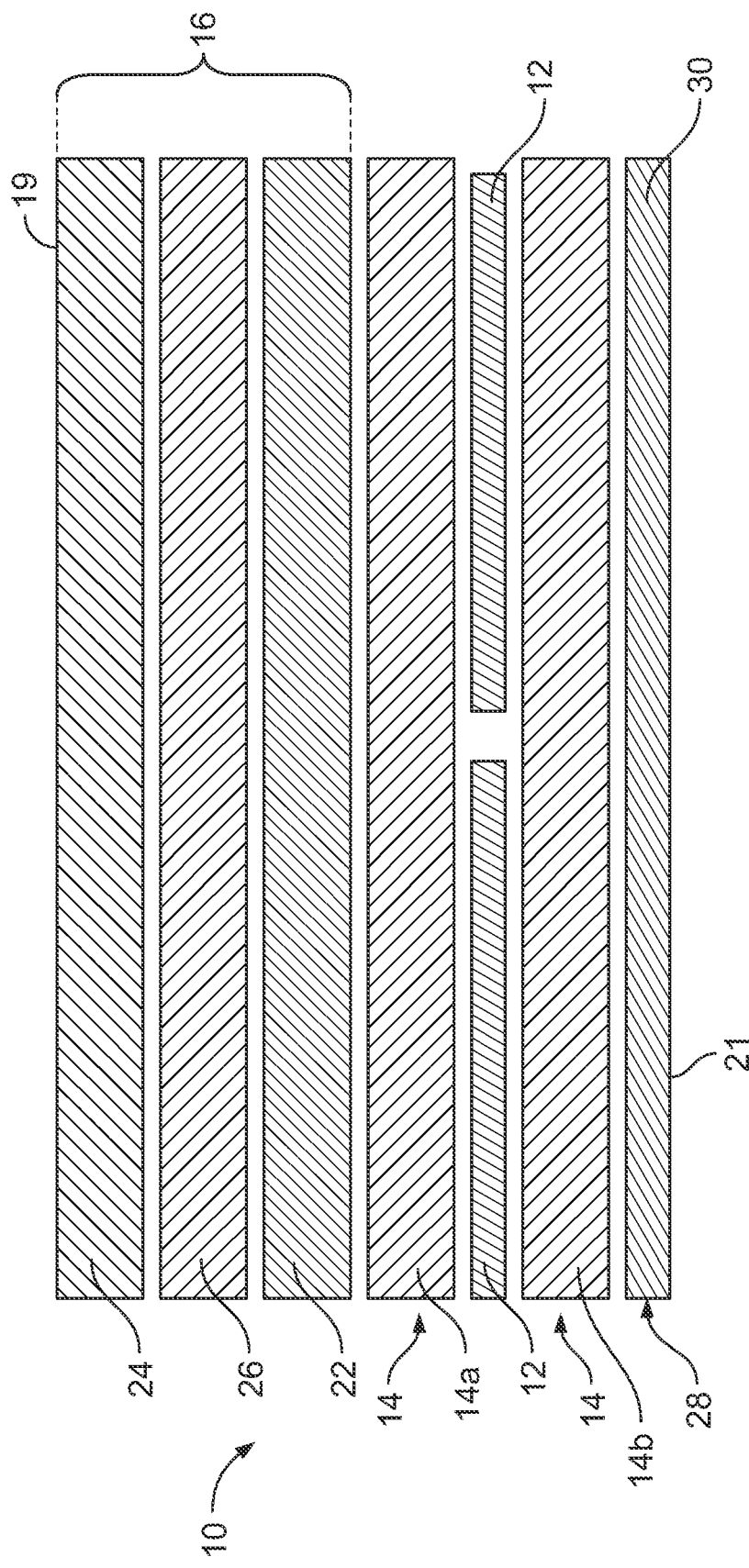

Referring to FIGS. 1A and 1B, in some embodiments, a photovoltaic module 10 includes at least one solar cell 12, an encapsulant 14 encapsulating the at least one solar cell 12, and a frontsheet 16 juxtaposed with the encapsulant 14. In some embodiments, the frontsheet 16 is juxtaposed with a first surface of the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14. In some embodiments, the encapsulant 14 encapsulates 50% to 99.9% of an exterior surface area of the at least one solar cell 12. In another embodiment, the encapsulant 14 encapsulates 55% to 99.9% of an exterior surface area of the at least one solar cell 12. In another embodiment, the encapsulant 14 encapsulates 60% to 99.9% of an exterior surface area of the at least one solar cell 12. In another embodiment, the encapsulant 14 encapsulates 65% to 99.9% of an exterior surface area of the at least one solar cell 12. In another embodiment, the encapsulant 14 encapsulates 70% to 99.9% of an exterior surface area of the at least one solar cell 12. In another embodiment, the encapsulant 14 encapsulates 75% to 99.9% of an exterior surface area of the at least one solar cell 12. In another embodiment, the encapsulant 14 encapsulates 80% to 99.9% of an exterior surface area of the at least one solar cell 12. In another embodiment, the encapsulant 14 encapsulates 85% to 99.9% of an exterior surface area of the at least one solar cell 12. In another embodiment, the encapsulant 14 encapsulates 90% to 99.9% of an exterior surface area of the at least one solar cell 12. In another embodiment, the encapsulant 14 encapsulates 95% to 99.9% of an exterior surface area of the at least one solar cell 12.

In another embodiment, the encapsulant 14 encapsulates 50% to 95% of an exterior surface area of the at least one solar cell 12. In another embodiment, the encapsulant 14 encapsulates 55% to 95% of an exterior surface area of the at least one solar cell 12. In another embodiment, the encapsulant 14 encapsulates 60% to 95% of an exterior surface area of the at least one solar cell 12. In another embodiment, the encapsulant 14 encapsulates 65% to 95% of an exterior surface area of the at least one solar cell 12. In another embodiment, the encapsulant 14 encapsulates 70% to 95% of an exterior surface area of the at least one solar cell 12. In another embodiment, the encapsulant 14 encapsulates 75% to 95% of an exterior surface area of the at least one solar cell 12. In another embodiment, the encapsulant 14 encapsulates 80% to 95% of an exterior surface area of the at least one solar cell 12. In another embodiment, the encapsulant 14 encapsulates 85% to 95% of an exterior surface area of the at least one solar cell 12. In another embodiment, the encapsulant 14 encapsulates 90% to 95% of an exterior surface area of the at least one solar cell 12.

In another embodiment, the encapsulant 14 encapsulates 50% to 90% of an exterior surface area of the at least one solar cell 12. In another embodiment, the encapsulant 14 encapsulates 55% to 90% of an exterior surface area of the at least one solar 12. In another embodiment, the encapsulant 14 encapsulates 60% to 90% of an exterior surface area of the at least one solar cell 12. In another embodiment, the encapsulant 14 encapsulates 65% to 90% of an exterior surface area of the at least one solar cell 12. In another embodiment, the encapsulant 14 encapsulates 70% to 90% of an exterior surface area of the at least one solar cell 12. In another embodiment, the encapsulant 14 encapsulates 75% to 90% of an exterior surface area of the at least one solar cell 12. In another embodiment, the encapsulant 14 encapsulates 80% to 90% of an exterior surface area of the at least one solar cell 12. In another embodiment, the encapsulant 14 encapsulates 85% to 90% of an exterior surface area of the at least one solar cell 12.

In another embodiment, the encapsulant 14 encapsulates 50% to 85% of an exterior surface area of the at least one solar cell 12. In another embodiment, the encapsulant 14 encapsulates 55% to 85% of an exterior surface area of the at least one solar cell 12. In another embodiment, the encapsulant 14 encapsulates 60% to 85% of an exterior surface area of the at least one solar cell 12. In another embodiment, the encapsulant 14 encapsulates 65% to 85% of an exterior surface area of the at least one solar cell 12. In another embodiment, the encapsulant 14 encapsulates 70% to 85% of an exterior surface area of the at least one solar cell 12. In another embodiment, the encapsulant 14 encapsulates 75% to 85% of an exterior surface area of the at least one solar cell 12. In another embodiment, the encapsulant 14 encapsulates 80% to 85% of an exterior surface area of the at least one solar cell 12.

In another embodiment, the encapsulant 14 encapsulates 50% to 80% of an exterior surface area of the at least one solar cell 12. In another embodiment, the encapsulant 14 encapsulates 55% to 80% of an exterior surface area of the at least one solar cell 12. In another embodiment, the encapsulant 14 encapsulates 60% to 80% of an exterior surface area of the at least one solar cell 12. In another embodiment, the encapsulant 14 encapsulates 65% to 80% of an exterior surface area of the at least one solar cell 12. In another embodiment, the encapsulant 14 encapsulates 70% to 80% of an exterior surface area of the at least one solar cell 12. In another embodiment, the encapsulant 14 encapsulates 75% to 80% of an exterior surface area of the at least one solar cell 12.

In another embodiment, the encapsulant 14 encapsulates 50% to 75% of an exterior surface area of the at least one solar cell 12. In another embodiment, the encapsulant 14 encapsulates 55% to 75% of an exterior surface area of the at least one solar cell 12. In another embodiment, the encapsulant 14 encapsulates 60% to 75% of an exterior surface area of the at least one solar cell 12. In another embodiment, the encapsulant 14 encapsulates 65% to 75% of an exterior surface area of the at least one solar cell 12. In another embodiment, the encapsulant 14 encapsulates 70% to 75% of an exterior surface area of the at least one solar cell 12.

In another embodiment, the encapsulant 14 encapsulates 50% to 70% of an exterior surface area of the at least one solar cell 12. In another embodiment, the encapsulant 14 encapsulates 55% to 70% of an exterior surface area of the at least one solar cell 12. In another embodiment, the encapsulant 14 encapsulates 60% to 70% of an exterior surface area of the at least one solar cell 12. In another embodiment, the encapsulant 14 encapsulates 65% to 70% of an exterior surface area of the at least one solar cell 12.

In another embodiment, the encapsulant 14 encapsulates 50% to 65% of an exterior surface area of the at least one solar cell 12. In another embodiment, the encapsulant 14 encapsulates 55% to 65% of an exterior surface area of the at least one solar cell 12. In another embodiment, the encapsulant 14 encapsulates 60% to 65% of an exterior surface area of the at least one solar cell 12. In another embodiment, the encapsulant 14 encapsulates 50% to 60% of an exterior surface area of the at least one solar cell 12. In another embodiment, the encapsulant 14 encapsulates 55% to 60% of an exterior surface area of the at least one solar cell 12. In another embodiment, the encapsulant 14 encapsulates 55% to 60% of an exterior surface area of the at least one solar cell 12.

In some embodiments, the encapsulant 14 encapsulates 50% of an exterior surface area of the at least one solar cell 12. In another embodiment, the encapsulant 14 encapsulates 55% of the exterior surface area of the at least one solar cell 12. In another embodiment, the encapsulant 14 encapsulates 60% of the exterior surface area of the at least one solar cell 12. In another embodiment, the encapsulant 14 encapsulates 65% of the exterior surface area of the at least one solar cell 12. In another embodiment, the encapsulant 14 encapsulates 70% of the exterior surface area of the at least one solar cell 12. In another embodiment, the encapsulant 14 encapsulates 75% of the exterior surface area of the at least one solar cell 12. In another embodiment, the encapsulant 14 encapsulates 80% of the exterior surface area of the at least one solar cell 12. In another embodiment, the encapsulant 14 encapsulates 85% of the exterior surface area of the at least one solar cell 12. In another embodiment, the encapsulant 14 encapsulates 90% of the exterior surface area of the at least one solar cell 12. In another embodiment, the encapsulant 14 encapsulates 95% of the exterior surface area of the at least one solar cell 12. In another embodiment, the encapsulant 14 encapsulates 100% of the exterior surface area of the at least one solar cell 12.

In some embodiments, the encapsulant 14 has a thickness of 0.5 mm to 4 mm. In another embodiment, the encapsulant 14 has a thickness of 0.5 mm to 3.5 mm. In another embodiment, the encapsulant 14 has a thickness of 0.5 mm to 3 mm. In another embodiment, the encapsulant 14 has a thickness of 0.5 mm to 2.5 mm. In another embodiment, the encapsulant 14 has a thickness of 0.5 mm to 2 mm. In another embodiment, the encapsulant 14 has a thickness of 0.5 mm to 1.5 mm. In another embodiment, the encapsulant 14 has a thickness of 0.5 mm to 1 mm.

In some embodiments, the encapsulant 14 has a thickness of 1 mm to 4 mm. In another embodiment, the encapsulant 14 has a thickness of 1 mm to 3.5 mm. In another embodiment, the encapsulant 14 has a thickness of 1 mm to 3 mm. In another embodiment, the encapsulant 14 has a thickness of 1 mm to 2.5 mm. In another embodiment, the encapsulant 14 has a thickness of 1 mm to 2 mm. In another embodiment, the encapsulant 14 has a thickness of 1 mm to 1.5 mm. In some embodiments, the encapsulant 14 has a thickness of 1.5 mm to 4 mm. In another embodiment, the encapsulant 14 has a thickness of 1.5 mm to 3.5 mm. In another embodiment, the encapsulant 14 has a thickness of 1.5 mm to 3 mm. In another embodiment, the encapsulant 14 has a thickness of 1.5 mm to 2.5 mm. In another embodiment, the encapsulant 14 has a thickness of 1.5 mm to 2 mm.

In some embodiments, the encapsulant 14 has a thickness of 2 mm to 4 mm. In another embodiment, the encapsulant 14 has a thickness of 2 mm to 3.5 mm. In another embodiment, the encapsulant 14 has a thickness of 2 mm to 3 mm. In another embodiment, the encapsulant 14 has a thickness of 2 mm to 2.5 mm. In some embodiments, the encapsulant 14 has a thickness of 2.5 mm to 4 mm. In another embodiment, the encapsulant 14 has a thickness of 2.5 mm to 3.5 mm. In another embodiment, the encapsulant 14 has a thickness of 2.5 mm to 3 mm. In some embodiments, the encapsulant 14 has a thickness of 3 mm to 4 mm. In another embodiment, the encapsulant 14 has a thickness of 3 mm to 3.5 mm. In some embodiments, the encapsulant 14 has a thickness of 3.5 mm to 4 mm.

In some embodiments, the encapsulant 14 has a thickness of 0.5 mm. In some embodiments, the encapsulant 14 has a thickness of 0.6 mm. In some embodiments, the encapsulant 14 has a thickness of 0.7 mm. In some embodiments, the encapsulant 14 has a thickness of 0.8 mm. In some embodiments, the encapsulant 14 has a thickness of 0.9 mm. In some embodiments, the encapsulant 14 has a thickness of 1 mm. In some embodiments, the encapsulant 14 has a thickness of 1.5 mm. In some embodiments, the encapsulant 14 has a thickness of 2 mm. In some embodiments, the encapsulant 14 has a thickness of 2.5 mm. In some embodiments, the encapsulant 14 has a thickness of 3 mm. In some embodiments, the encapsulant 14 has a thickness of 3.5 mm. In some embodiments, the encapsulant 14 has a thickness of 4 mm.

In some embodiments, a first layer 14a of the encapsulant 14 has a thickness of 0.2 mm to 2 mm. In some embodiments, the first layer 14a of the encapsulant 14 has a thickness of 0.2 mm to 1.5 mm. In some embodiments, the first layer 14a of the encapsulant 14 has a thickness of 0.2 mm to 1 mm. In some embodiments, the first layer 14a of the encapsulant 14 has a thickness of 0.2 mm to 0.6 mm. In some embodiments, the first layer 14a of the encapsulant 14 has a thickness of 0.2 mm to 0.5 mm. In some embodiments, the first layer 14a of the encapsulant 14 has a thickness of 0.5 mm to 2 mm. In some embodiments, the first layer 14a of the encapsulant 14 has a thickness of 0.5 mm to 1.5 mm. In some embodiments, the first layer 14a of the encapsulant 14 has a thickness of 0.5 mm to 1 mm. In some embodiments, the first layer 14a of the encapsulant 14 has a thickness of 1 mm to 2 mm. In some embodiments, the first layer 14a of the encapsulant 14 has a thickness of 1 mm to 1.5 mm. In some embodiments, the first layer 14a of the encapsulant 14 has a thickness of 1.5 mm to 2 mm.

In some embodiments, the first layer 14a of the encapsulant 14 has a thickness of 0.2 mm. In some embodiments, the first layer 14a of the encapsulant 14 has a thickness of 0.3 mm. In some embodiments, the first layer 14a of the encapsulant 14 has a thickness of 0.4 mm. In some embodiments, the first layer 14a of the encapsulant 14 has a thickness of 0.45 mm. In some embodiments, the first layer 14a of the encapsulant 14 has a thickness of 0.5 mm. In some embodiments, the first layer 14a of the encapsulant 14 has a thickness of 0.6 mm. In some embodiments, the first layer 14a of the encapsulant 14 has a thickness of 1 mm. In some embodiments, the first layer 14a of the encapsulant 14 has a thickness of 1.5 mm. In some embodiments, the first layer 14a of the encapsulant 14 has a thickness of 2 mm. In some embodiments, the first layer 14a of the encapsulant 14 has a thickness of 2.5 mm. In some embodiments, the first layer 14a of the encapsulant 14 has a thickness of 3 mm. In some embodiments, the first layer 14a of the encapsulant 14 has a thickness of 3.5 mm. In some embodiments, the first layer 14a of the encapsulant 14 has a thickness of 4 mm.

In some embodiments, a second layer 14b of the encapsulant 14 has a thickness of 0.2 mm to 2 mm. In some embodiments, the second layer 14b of the encapsulant 14 has a thickness of 0.2 mm to 1.5 mm. In some embodiments, the second layer 14b of the encapsulant 14 has a thickness of 0.2 mm to 1 mm. In some embodiments, the second layer 14b of the encapsulant 14 has a thickness of 0.2 mm to 0.5 mm. In some embodiments, the second layer 14b of the encapsulant 14 has a thickness of 0.5 mm to 2 mm. In some embodiments, the second layer 14b of the encapsulant 14 has a thickness of 0.5 mm to 1.5 mm. In some embodiments, the second layer 14b of the encapsulant 14 has a thickness of 0.5 mm to 1 mm. In some embodiments, the second layer 14b of the encapsulant 14 has a thickness of 1 mm to 2 mm. In some embodiments, the second layer 14b of the encapsulant 14 has a thickness of 1 mm to 1.5 mm. In some embodiments, the second layer 14b of the encapsulant 14 has a thickness of 1.5 mm to 2 mm.

In some embodiments, the second layer 14b of the encapsulant 14 has a thickness of 0.2 mm. In some embodiments, the second layer 14b of the encapsulant 14 has a thickness of 0.3 mm. In some embodiments, the second layer 14b of the encapsulant 14 has a thickness of 0.4 mm. In some embodiments, the second layer 14b of the encapsulant 14 has a thickness of 0.45 mm. In some embodiments, the second layer 14b of the encapsulant 14 has a thickness of 0.5 mm. In some embodiments, the second layer 14b of the encapsulant 14 has a thickness of 1 mm. In some embodiments, the second layer 14b of the encapsulant 14 has a thickness of 1.5 mm. In some embodiments, the second layer 14b of the encapsulant 14 has a thickness of 2 mm. In some embodiments, the second layer 14b of the encapsulant 14 has a thickness of 2.5 mm. In some embodiments, the second layer 14b of the encapsulant 14 has a thickness of 3 mm. In some embodiments, the second layer 14b of the encapsulant 14 has a thickness of 3.5 mm. In some embodiments, the second layer 14b of the encapsulant 14 has a thickness of 4 mm.

In some embodiments, the thickness of the first layer 14a is equal to the thickness of the second layer 14b. In another embodiment, the thickness of the first layer 14a is different from the thickness of the second layer 14b.

In some embodiments, the encapsulant 14 may be made from polyolefins, ethyl vinyl acetates, ionomers, silicones, poly vinyl butyral, epoxies, polyurethanes, or combinations/hybrids thereof. In some embodiments, the encapsulant 14 is made from thermosetting polyolefin.

In some embodiments, the photovoltaic module 10 includes a first end 18, a second end 20 opposite the first end 18, a first surface 19 extending from the first end 18 to the second end 20, and a second surface 21 opposite the first surface 19 and extending from the first end 18 to the second end 20. In some embodiments, the first surface 19 is an upper, sun facing-side surface of the photovoltaic module 10, and the second surface 21 is a lower surface configured to face a roof deck on which the photovoltaic module 10 is installed on the roof deck.

In some embodiments, the at least one solar cell 12 includes a plurality of the solar cells 12. In some embodiments, the plurality of solar cells 12 includes two solar cells. In some embodiments, the plurality of solar cells 12 includes three solar cells. In some embodiments, the plurality of solar cells 12 includes four solar cells. In some embodiments, the plurality of solar cells 12 includes five solar cells. In some embodiments, the plurality of solar cells 12 includes six solar cells. In some embodiments, the plurality of solar cells 12 includes seven solar cells. In some embodiments, the plurality of solar cells 12 includes eight solar cells. In some embodiments, the plurality of solar cells 12 includes nine solar cells. In some embodiments, the plurality of solar cells 12 includes ten solar cells. In some embodiments, the plurality of solar cells 12 includes eleven solar cells. In some embodiments, the plurality of solar cells 12 includes twelve solar cells. In some embodiments, the plurality of solar cells 12 includes thirteen solar cells. In some embodiments, the plurality of solar cells 12 includes fourteen solar cells. In some embodiments, the plurality of solar cells 12 includes fifteen solar cells. In some embodiments, the plurality of solar cells 12 includes sixteen solar cells. In some embodiments, the plurality of solar cells 12 includes more than sixteen solar cells.

In some embodiments, the plurality of solar cells 12 is arranged in one row (i.e., one reveal). In another embodiment, the plurality of solar cells 12 is arranged in two rows (i.e., two reveals). In another embodiment, the plurality of solar cells 12 is arranged in three rows (i.e., three reveals). In another embodiment, the plurality of solar cells 12 is arranged in four rows (i.e., four reveals). In another embodiment, the plurality of solar cells 12 is arranged in five rows (i.e., five reveals). In another embodiment, the plurality of solar cells 12 is arranged in six rows (i.e., six reveals). In other embodiments, the plurality of solar cells 12 is arranged in more than six rows.

In some embodiments, the frontsheet 16 includes a glass layer 22 and a polymer layer 24 attached to a first surface of the glass layer 22. In some embodiments, the frontsheet 16 is juxtaposed with the first layer 14a of the encapsulant 14. In some embodiments, each of the encapsulant 14, the glass layer 22, and the polymer layer 24 is transparent. In some embodiments, the polymer layer 24 is attached to the glass layer 22 by an first adhesive layer 26. In some embodiments, the first adhesive layer 26 may include polyvinyl butyrate, acrylic, silicone, or polycarbonate. In another embodiment, the first adhesive layer 26 may include pressure sensitive adhesives. In another embodiment, the polymer layer 24 is attached to the glass layer 22 by thermal bonding. In another embodiment, the frontsheet 16 includes at least one of the glass layer 22 or the polymer layer 24. In some embodiments, the first adhesive layer 26 is transparent. As used herein, the term "transparent" means having a solar weighted transmittance of 80% or greater, and with respect to certain embodiments of the photovoltaic module 10, a transparent layer of the photovoltaic module has a solar weighted transmittance of 80% or greater. In another embodiment, the frontsheet 16 does not include the glass layer 22.

In some embodiments, the glass layer 22 has a thickness of 1 mm to 4 mm. In some embodiments, the glass layer 22 has a thickness of 1 mm to 3.5 mm. In some embodiments, the glass layer 22 has a thickness of 1 mm to 3 mm. In some embodiments, the glass layer 22 has a thickness of 1 mm to 2.5 mm. In some embodiments, the glass layer 22 has a thickness of 1 mm to 2 mm. In some embodiments, the glass layer 22 has a thickness of 1 mm to 1.5 mm. In some embodiments, the glass layer 22 has a thickness of 1.5 mm to 4 mm. In some embodiments, the glass layer 22 has a thickness of 1.5 mm to 3.5 mm. In some embodiments, the glass layer 22 has a thickness of 1.5 mm to 3 mm. In some embodiments, the glass layer 22 has a thickness of 1 mm to 2.5 mm. In some embodiments, the glass layer 22 has a thickness of 1.5 mm to 2 mm.

In some embodiments, the glass layer 22 has a thickness of 2 mm to 4 mm. In some embodiments, the glass layer 22 has a thickness of 2 mm to 3.5 mm. In some embodiments, the glass layer 22 has a thickness of 2 mm to 3 mm. In some embodiments, the glass layer 22 has a thickness of 2 mm to 2.5 mm. In some embodiments, the glass layer 22 has a thickness of 2.5 mm to 4 mm. In some embodiments, the glass layer 22 has a thickness of 2.5 mm to 3.5 mm. In some embodiments, the glass layer 22 has a thickness of 2.5 mm to 3 mm. In some embodiments, the glass layer 22 has a thickness of 3 mm to 4 mm. In some embodiments, the glass layer 22 has a thickness of 3 mm to 3.5 mm. In some embodiments, the glass layer 22 has a thickness of 3.5 mm to 4 mm.

In some embodiments, the glass layer 22 has a thickness of 1 mm. In some embodiments, the glass layer 22 has a thickness of 1.5 mm. In some embodiments, the glass layer 22 has a thickness of 2 mm. In some embodiments, the glass layer 22 has a thickness of 2.5 mm. In some embodiments, the glass layer 22 has a thickness of 3 mm. In some embodiments, the glass layer 22 has a thickness of 3.5 mm. In some embodiments, the glass layer 22 has a thickness of 4 mm.

In some embodiments, the first adhesive layer 26 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the first adhesive layer 26 has a thickness of 0.2 mm to 2 mm. In some embodiments, the first adhesive layer 26 has a thickness of 0.2 mm to 1.5 mm. In some embodiments, the first adhesive layer 26 has a thickness of 0.2 mm to 1 mm. In some embodiments, the first adhesive layer 26 has a thickness of 0.2 mm to 0.5 mm. In some embodiments, the first adhesive layer 26 has a thickness of 0.5 mm to 2 mm. In some embodiments, the first adhesive layer 26 has a thickness of 0.5 mm to 1.5 mm. In some embodiments, the first adhesive layer 26 has a thickness of 0.5 mm to 1 mm. In some embodiments, the first adhesive layer 26 has a thickness of 1 mm to 2 mm. In some embodiments, the first adhesive layer 26 has a thickness of 1 mm to 1.5 mm. In some embodiments, the first adhesive layer 26 has a thickness of 1.5 mm to 2 mm.

In some embodiments, the first adhesive layer 26 has a thickness of 0.2 mm. In some embodiments, the first adhesive layer 26 has a thickness of 0.3 mm. In some embodiments, the first adhesive layer 26 has a thickness of 0.4 mm. In some embodiments, the first adhesive layer 26 has a thickness of 0.45 mm. In some embodiments, the first adhesive layer 26 has a thickness of 0.5 mm. In some embodiments, the first adhesive layer 26 has a thickness of 1 mm. In some embodiments, the first adhesive layer 26 has a thickness of 1.5 mm. In some embodiments, the first adhesive layer 26 has a thickness of 2 mm. In some embodiments, the first adhesive layer 26 has a thickness of 2.5 mm. In some embodiments, the first adhesive layer 26 has a thickness of 3 mm. In some embodiments, the first adhesive layer 26 has a thickness of 3.5 mm. In some embodiments, the first adhesive layer 26 has a thickness of 4 mm.

In another embodiment, the first adhesive layer 26 has a thickness of 1 μm to 900 μm. In some embodiments, the first adhesive layer 26 has a thickness of 1 μm to 900 μm. In some embodiments, the first adhesive layer 26 has a thickness of 1 μm to 850 μm. In some embodiments, the first adhesive layer 26 has a thickness of 1 μm to 800 μm. In some embodiments, the first adhesive layer 26 has a thickness of 1 μm to 750 μm. In some embodiments, the first adhesive layer 26 has a thickness of 1 μm to 700 μm. In some embodiments, the first adhesive layer 26 has a thickness of 1 μm to 650 μm. In some embodiments, the first adhesive layer 26 has a thickness of 1 μm to 600 μm. In some embodiments, the first adhesive layer 26 has a thickness of 1 μm to 550 μm. In some embodiments, the first adhesive layer 26 has a thickness of 1 μm to 500 μm. In some embodiments, the first adhesive layer 26 has a thickness of 1 μm to 450 μm. In some embodiments, the first adhesive layer 26 has a thickness of 1 μm to 400 μm. In some embodiments, the first adhesive layer 26 has a thickness of 1 μm to 350 μm. In some embodiments, the first adhesive layer 26 has a thickness of 1 μm to 300 μm. In some embodiments, the first adhesive layer 26 has a thickness of 1 μm to 250 μm. In some embodiments, the first adhesive layer 26 has a thickness of 1 μm to 200 μm. In some embodiments, the first adhesive layer 26 has a thickness of 1 μm to 150 μm. In some embodiments, the first adhesive layer 26 has a thickness of 1 μm to 100 μm. In some embodiments, the first adhesive layer 26 has a thickness of 1 μm to 50 μm.

In some embodiments, the first adhesive layer 26 has a thickness of 50 μm to 900 μm. In some embodiments, the first adhesive layer 26 has a thickness of 50 μm to 850 μm. In some embodiments, the first adhesive layer 26 has a thickness of 50 μm to 800 μm. In some embodiments, the first adhesive layer 26 has a thickness of 50 μm to 750 μm. In some embodiments, the first adhesive layer 26 has a thickness of 50 μm to 700 μm. In some embodiments, the first adhesive layer 26 has a thickness of 50 μm to 650 μm. In some embodiments, the first adhesive layer 26 has a thickness of 50 μm to 600 μm. In some embodiments, the first adhesive layer 26 has a thickness of 50 μm to 550 μm. In some embodiments, the first adhesive layer 26 has a thickness of 50 μm to 500 μm. In some embodiments, the first adhesive layer 26 has a thickness of 50 μm to 450 μm.

In some embodiments, the first adhesive layer 26 has a thickness of 50 μm to 400 μm. In some embodiments, the first adhesive layer 26 has a thickness of 50 μm to 350 μm. In some embodiments, the first adhesive layer 26 has a thickness of 50 μm to 300 μm. In some embodiments, the first adhesive layer 26 has a thickness of 50 μm to 250 μm. In some embodiments, the first adhesive layer 26 has a thickness of 50 μm to 200 μm. In some embodiments, the first adhesive layer 26 has a thickness of 50 μm to 150 μm. In some embodiments, the first adhesive layer 26 has a thickness of 50 μm to 100 μm.

In some embodiments, the first adhesive layer 26 has a thickness of 100 μm to 900 μm. In some embodiments, the first adhesive layer 26 has a thickness of 100 μm to 850 μm. In some embodiments, the first adhesive layer 26 has a thickness of 100 μm to 800 μm. In some embodiments, the first adhesive layer 26 has a thickness of 100 μm to 750 μm. In some embodiments, the first adhesive layer 26 has a thickness of 100 μm to 700 μm. In some embodiments, the first adhesive layer 26 has a thickness of 100 μm to 650 μm. In some embodiments, the first adhesive layer 26 has a thickness of 100 μm to 600 μm. In some embodiments, the first adhesive layer 26 has a thickness of 100 μm to 550 μm. In some embodiments, the first adhesive layer 26 has a thickness of 100 μm to 500 μm. In some embodiments, the first adhesive layer 26 has a thickness of 100 μm to 450 μm. In some embodiments, the first adhesive layer 26 has a thickness of 100 μm to 400 μm. In some embodiments, the first adhesive layer 26 has a thickness of 100 μm to 350 μm. In some embodiments, the first adhesive layer 26 has a thickness of 100 μm to 300 μm. In some embodiments, the first adhesive layer 26 has a thickness of 100 μm to 250 μm. In some embodiments, the first adhesive layer 26 has a thickness of 100 μm to 200 μm. In some embodiments, the first adhesive layer 26 has a thickness of 100 μm to 150 μm.

In some embodiments, the first adhesive layer 26 has a thickness of 150 μm to 900 μm. In some embodiments, the first adhesive layer 26 has a thickness of 150 μm to 850 μm. In some embodiments, the first adhesive layer 26 has a thickness of 150 μm to 800 μm. In some embodiments, the first adhesive layer 26 has a thickness of 150 μm to 750 μm. In some embodiments, the first adhesive layer 26 has a thickness of 150 μm to 700 μm. In some embodiments, the first adhesive layer 26 has a thickness of 150 μm to 650 μm. In some embodiments, the first adhesive layer 26 has a thickness of 150 μm to 600 μm. In some embodiments, the first adhesive layer 26 has a thickness of 150 μm to 550 μm. In some embodiments, the first adhesive layer 26 has a thickness of 150 μm to 500 μm. In some embodiments, the first adhesive layer 26 has a thickness of 150 μm to 450 μm. In some embodiments, the first adhesive layer 26 has a thickness of 150 μm to 400 μm. In some embodiments, the first adhesive layer 26 has a thickness of 150 μm to 350 μm. In some embodiments, the first adhesive layer 26 has a thickness of 150 μm to 300 μm. In some embodiments, the first adhesive layer 26 has a thickness of 150 μm to 250 μm. In some embodiments, the first adhesive layer 26 has a thickness of 150 μm to 200 μm.

In some embodiments, the first adhesive layer 26 has a thickness of 200 μm to 900 μm. In some embodiments, the first adhesive layer 26 has a thickness of 200 μm to 850 μm. In some embodiments, the first adhesive layer 26 has a thickness of 200 μm to 800 μm. In some embodiments, the first adhesive layer 26 has a thickness of 200 μm to 750 μm. In some embodiments, the first adhesive layer 26 has a thickness of 200 μm to 700 μm. In some embodiments, the first adhesive layer 26 has a thickness of 200 μm to 650 μm. In some embodiments, the first adhesive layer 26 has a thickness of 200 μm to 600 μm. In some embodiments, the first adhesive layer 26 has a thickness of 200 μm to 550 μm. In some embodiments, the first adhesive layer 26 has a thickness of 200 μm to 500 μm. In some embodiments, the first adhesive layer 26 has a thickness of 200 μm to 450 μm. In some embodiments, the first adhesive layer 26 has a thickness of 200 μm to 400 μm. In some embodiments, the first adhesive layer 26 has a thickness of 200 μm to 350 μm. In some embodiments, the first adhesive layer 26 has a thickness of 200 μm to 300 μm. In some embodiments, the first adhesive layer 26 has a thickness of 200 μm to 250 μm.

In some embodiments, the first adhesive layer 26 has a thickness of 250 μm to 900 μm. In some embodiments, the first adhesive layer 26 has a thickness of 250 μm to 850 μm. In some embodiments, the first adhesive layer 26 has a thickness of 250 μm to 800 μm. In some embodiments, the first adhesive layer 26 has a thickness of 250 μm to 750 μm. In some embodiments, the first adhesive layer 26 has a thickness of 250 μm to 700 μm. In some embodiments, the first adhesive layer 26 has a thickness of 250 μm to 650 μm. In some embodiments, the first adhesive layer 26 has a thickness of 250 μm to 600 μm. In some embodiments, the first adhesive layer 26 has a thickness of 250 μm to 550 μm. In some embodiments, the first adhesive layer 26 has a thickness of 250 μm to 500 μm. In some embodiments, the first adhesive layer 26 has a thickness of 250 μm to 450 μm. In some embodiments, the first adhesive layer 26 has a thickness of 250 μm to 400 μm. In some embodiments, the first adhesive layer 26 has a thickness of 250 μm to 350 μm. In some embodiments, the first adhesive layer 26 has a thickness of 250 μm to 300 μm.

In some embodiments, the first adhesive layer 26 has a thickness of 300 μm to 900 μm. In some embodiments, the first adhesive layer 26 has a thickness of 300 μm to 850 μm. In some embodiments, the first adhesive layer 26 has a thickness of 300 μm to 800 μm. In some embodiments, the first adhesive layer 26 has a thickness of 300 μm to 750 μm. In some embodiments, the first adhesive layer 26 has a thickness of 300 μm to 700 μm. In some embodiments, the first adhesive layer 26 has a thickness of 300 μm to 650 μm. In some embodiments, the first adhesive layer 26 has a thickness of 300 μm to 600 μm. In some embodiments, the first adhesive layer 26 has a thickness of 300 μm to 550 μm. In some embodiments, the first adhesive layer 26 has a thickness of 300 μm to 500 μm. In some embodiments, the first adhesive layer 26 has a thickness of 300 μm to 450 μm. In some embodiments, the first adhesive layer 26 has a thickness of 300 μm to 400 μm. In some embodiments, the first adhesive layer 26 has a thickness of 300 μm to 350 μm.

In some embodiments, the first adhesive layer 26 has a thickness of 350 μm to 900 μm. In some embodiments, the first adhesive layer 26 has a thickness of 350 μm to 850 μm. In some embodiments, the first adhesive layer 26 has a thickness of 350 μm to 800 μm. In some embodiments, the first adhesive layer 26 has a thickness of 350 μm to 750 μm. In some embodiments, the first adhesive layer 26 has a thickness of 350 μm to 700 μm. In some embodiments, the first adhesive layer 26 has a thickness of 350 μm to 650 μm. In some embodiments, the first adhesive layer 26 has a thickness of 350 μm to 600 μm. In some embodiments, the first adhesive layer 26 has a thickness of 350 μm to 550 μm. In some embodiments, the first adhesive layer 26 has a thickness of 350 μm to 500 μm. In some embodiments, the first adhesive layer 26 has a thickness of 350 μm to 450 μm. In some embodiments, the first adhesive layer 26 has a thickness of 350 μm to 400 μm.

In some embodiments, the first adhesive layer 26 has a thickness of 400 μm to 900 μm. In some embodiments, the first adhesive layer 26 has a thickness of 400 μm to 850 μm. In some embodiments, the first adhesive layer 26 has a thickness of 400 μm to 800 μm. In some embodiments, the first adhesive layer 26 has a thickness of 400 μm to 750 μm. In some embodiments, the first adhesive layer 26 has a thickness of 400 μm to 700 μm. In some embodiments, the first adhesive layer 26 has a thickness of 400 μm to 650 μm. In some embodiments, the first adhesive layer 26 has a thickness of 400 μm to 600 μm. In some embodiments, the first adhesive layer 26 has a thickness of 400 μm to 550 μm. In some embodiments, the first adhesive layer 26 has a thickness of 400 μm to 500 μm. In some embodiments, the first adhesive layer 26 has a thickness of 400 μm to 450 μm.

In some embodiments, the first adhesive layer 26 has a thickness of 450 μm to 900 μm. In some embodiments, the first adhesive layer 26 has a thickness of 450 μm to 850 μm. In some embodiments, the first adhesive layer 26 has a thickness of 450 μm to 800 μm. In some embodiments, the first adhesive layer 26 has a thickness of 450 μm to 750 μm. In some embodiments, the first adhesive layer 26 has a thickness of 450 μm to 700 μm. In some embodiments, the first adhesive layer 26 has a thickness of 450 μm to 650 μm. In some embodiments, the first adhesive layer 26 has a thickness of 450 μm to 600 μm. In some embodiments, the first adhesive layer 26 has a thickness of 450 μm to 550 μm. In some embodiments, the first adhesive layer 26 has a thickness of 450 μm to 500 μm.

In some embodiments, the first adhesive layer 26 has a thickness of 500 μm to 900 μm. In some embodiments, the first adhesive layer 26 has a thickness of 500 μm to 850 μm. In some embodiments, the first adhesive layer 26 has a thickness of 500 μm to 800 μm. In some embodiments, the first adhesive layer 26 has a thickness of 500 μm to 750 μm. In some embodiments, the first adhesive layer 26 has a thickness of 500 μm to 700 μm. In some embodiments, the first adhesive layer 26 has a thickness of 500 μm to 650 μm. In some embodiments, the first adhesive layer 26 has a thickness of 500 μm to 600 μm. In some embodiments, the first adhesive layer 26 has a thickness of 500 μm to 550 μm.

In some embodiments, the first adhesive layer 26 has a thickness of 550 μm to 900 μm. In some embodiments, the first adhesive layer 26 has a thickness of 550 μm to 850 μm. In some embodiments, the first adhesive layer 26 has a thickness of 550 μm to 800 μm. In some embodiments, the first adhesive layer 26 has a thickness of 550 μm to 750 μm. In some embodiments, the first adhesive layer 26 has a thickness of 550 μm to 700 μm. In some embodiments, the first adhesive layer 26 has a thickness of 550 μm to 650 μm. In some embodiments, the first adhesive layer 26 has a thickness of 550 μm to 600 μm.

In some embodiments, the first adhesive layer 26 has a thickness of 600 μm to 900 μm. In some embodiments, the first adhesive layer 26 has a thickness of 600 μm to 850 μm. In some embodiments, the first adhesive layer 26 has a thickness of 600 μm to 800 μm. In some embodiments, the first adhesive layer 26 has a thickness of 600 μm to 750 μm. In some embodiments, the first adhesive layer 26 has a thickness of 600 μm to 700 μm. In some embodiments, the first adhesive layer 26 has a thickness of 600 μm to 650 μm.

In some embodiments, the first adhesive layer 26 has a thickness of 650 μm to 900 μm. In some embodiments, the first adhesive layer 26 has a thickness of 650 μm to 850 μm. In some embodiments, the first adhesive layer 26 has a thickness of 650 μm to 800 μm. In some embodiments, the first adhesive layer 26 has a thickness of 650 μm to 750 μm. In some embodiments, the first adhesive layer 26 has a thickness of 650 μm to 700 μm. In some embodiments, the first adhesive layer 26 has a thickness of 700 μm to 900 μm. In some embodiments, the first adhesive layer 26 has a thickness of 700 μm to 850 μm. In some embodiments, the first adhesive layer 26 has a thickness of 700 μm to 800 μm. In some embodiments, the first adhesive layer 26 has a thickness of 700 μm to 750 μm. In some embodiments, the first adhesive layer 26 has a thickness of 750 μm to 900 μm. In some embodiments, the first adhesive layer 26 has a thickness of 750 μm to 850 μm. In some embodiments, the first adhesive layer 26 has a thickness of 750 μm to 800 μm. In some embodiments, the first adhesive layer 26 has a thickness of 800 μm to 900 μm. In some embodiments, the first adhesive layer 26 has a thickness of 800 μm to 850 μm. In some embodiments, the first adhesive layer 26 has a thickness of 850 μm to 900 μm.

In some embodiments, the first adhesive layer 26 has a thickness of 1 μm. In some embodiments, the first adhesive layer 26 has a thickness of 50 μm. In some embodiments, the first adhesive layer 26 has a thickness of 100 μm. In some embodiments, the first adhesive layer 26 has a thickness of 1 μm. In some embodiments, the first adhesive layer 26 has a thickness of 150 μm. In some embodiments, the first adhesive layer 26 has a thickness of 200 μm. In some embodiments, the first adhesive layer 26 has a thickness of 250 μm. In some embodiments, the first adhesive layer 26 has a thickness of 300 μm. In some embodiments, the first adhesive layer 26 has a thickness of 350 μm. In some embodiments, the first adhesive layer 26 has a thickness of 400 μm. In some embodiments, the first adhesive layer 26 has a thickness of 450 μm. In some embodiments, the first adhesive layer 26 has a thickness of 500 μm. In some embodiments, the first adhesive layer 26 has a thickness of 550 μm. In some embodiments, the first adhesive layer 26 has a thickness of 600 μm. In some embodiments, the first adhesive layer 26 has a thickness of 650 μm. In some embodiments, the first adhesive layer 26 has a thickness of 700 μm. In some embodiments, the first adhesive layer 26 has a thickness of 750 μm. In some embodiments, the first adhesive layer 26 has a thickness of 800 μm. In some embodiments, the first adhesive layer 26 has a thickness of 850 μm. In some embodiments, the first adhesive layer 26 has a thickness of 900 μm.

In some embodiments, the polymer layer 24 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet is composed of fluoropolymers, acrylics, polyesters, silicones, polycarbonates, or combinations thereof. In other embodiments, the polymer layer 24 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 24 is composed of a crosslinked polymeric material. In some embodiments, 50% to 99% of the polymer chains of the polymeric material are crosslinked.

In some embodiments, the polymer layer 24 has a thickness of 0.01 mm to 0.5 mm. In some embodiments, the polymer layer 24 has a thickness of 0.01 mm to 0.45 mm. In some embodiments, the polymer layer 24 has a thickness of 0.01 mm to 0.4 mm. In some embodiments, the polymer layer 24 has a thickness of 0.01 mm to 0.35 mm. In some embodiments, the polymer layer 24 has a thickness of 0.01 mm to 0.3 mm. In some embodiments, the polymer layer 24 has a thickness of 0.01 mm to 0.25 mm. In some embodiments, the polymer layer 24 has a thickness of 0.01 mm to 0.2 mm. In some embodiments, the polymer layer 24 has a thickness of 0.01 mm to 0.15 mm. In some embodiments, the polymer layer 24 has a thickness of 0.01 mm to 0.1 mm. In some embodiments, the polymer layer 24 has a thickness of 0.01 mm to 0.05 mm.

In some embodiments, the polymer layer 24 has a thickness of 0.05 mm to 0.5 mm. In some embodiments, the polymer layer 24 has a thickness of 0.05 mm to 0.45 mm. In some embodiments, the polymer layer 24 has a thickness of 0.05 mm to 0.4 mm. In some embodiments, the polymer layer 24 has a thickness of 0.05 mm to 0.35 mm. In some embodiments, the polymer layer 24 has a thickness of 0.05 mm to 0.3 mm. In some embodiments, the polymer layer 24 has a thickness of 0.05 mm to 0.25 mm. In some embodiments, the polymer layer 24 has a thickness of 0.05 mm to 0.2 mm. In some embodiments, the polymer layer 24 has a thickness of 0.05 mm to 0.15 mm. In some embodiments, the polymer layer 24 has a thickness of 0.05 mm to 0.1 mm.

In some embodiments, the polymer layer 24 has a thickness of 0.1 mm to 0.5 mm. In some embodiments, the polymer layer 24 has a thickness of 0.1 mm to 0.45 mm. In some embodiments, the polymer layer 24 has a thickness of 0.1 mm to 0.4 mm. In some embodiments, the polymer layer 24 has a thickness of 0.1 mm to 0.35 mm. In some embodiments, the polymer layer 24 has a thickness of 0.1 mm to 0.3 mm. In some embodiments, the polymer layer 24 has a thickness of 0.1 mm to 0.25 mm. In some embodiments, the polymer layer 24 has a thickness of 0.1 mm to 0.2 mm. In some embodiments, the polymer layer 24 has a thickness of 0.1 mm to 0.15 mm. In some embodiments, the polymer layer 24 has a thickness of 0.15 mm to 0.5 mm. In some embodiments, the polymer layer 24 has a thickness of 0.15 mm to 0.45 mm. In some embodiments, the polymer layer 24 has a thickness of 0.15 mm to 0.4 mm. In some embodiments, the polymer layer 24 has a thickness of 0.15 mm to 0.35 mm. In some embodiments, the polymer layer 24 has a thickness of 0.15 mm to 0.3 mm. In some embodiments, the polymer layer 24 has a thickness of 0.15 mm to 0.25 mm. In some embodiments, the polymer layer 24 has a thickness of 0.15 mm to 0.2 mm.

In some embodiments, the polymer layer 24 has a thickness of 0.2 mm to 0.5 mm. In some embodiments, the polymer layer 24 has a thickness of 0.2 mm to 0.45 mm. In some embodiments, the polymer layer 24 has a thickness of 0.2 mm to 0.4 mm. In some embodiments, the polymer layer 24 has a thickness of 0.2 mm to 0.35 mm. In some embodiments, the polymer layer 24 has a thickness of 0.2 mm to 0.3 mm. In some embodiments, the polymer layer 24 has a thickness of 0.2 mm to 0.25 mm. In some embodiments, the polymer layer 24 has a thickness of 0.25 mm to 0.5 mm. In some embodiments, the polymer layer 24 has a thickness of 0.25 mm to 0.45 mm. In some embodiments, the polymer layer 24 has a thickness of 0.25 mm to 0.4 mm. In some embodiments, the polymer layer 24 has a thickness of 0.25 mm to 0.35 mm. In some embodiments, the polymer layer 24 has a thickness of 0.25 mm to 0.3 mm.

In some embodiments, the polymer layer 24 has a thickness of 0.3 mm to 0.5 mm. In some embodiments, the polymer layer 24 has a thickness of 0.3 mm to 0.45 mm. In some embodiments, the polymer layer 24 has a thickness of 0.3 mm to 0.4 mm. In some embodiments, the polymer layer 24 has a thickness of 0.3 mm to 0.35 mm. In some embodiments, the polymer layer 24 has a thickness of 0.35 mm to 0.5 mm. In some embodiments, the polymer layer 24 has a thickness of 0.35 mm to 0.45 mm. In some embodiments, the polymer layer 24 has a thickness of 0.35 mm to 0.4 mm. In some embodiments, the polymer layer 24 has a thickness of 0.4 mm to 0.5 mm. In some embodiments, the polymer layer 24 has a thickness of 0.4 mm to 0.45 mm. In some embodiments, the polymer layer 24 has a thickness of 0.45 mm to 0.5 mm.

In some embodiments, the polymer layer 24 has a thickness of 0.01 mm. In some embodiments, the polymer layer 24 has a thickness of 0.05 mm. In some embodiments, the polymer layer 24 has a thickness of 0.1 mm. In some embodiments, the polymer layer 24 has a thickness of 0.15 mm. In some embodiments, the polymer layer 24 has a thickness of 0.2 mm. In some embodiments, the polymer layer 24 has a thickness of 0.25 mm. In some embodiments, the polymer layer 24 has a thickness of 0.3 mm. In some embodiments, the polymer layer 24 has a thickness of 0.35 mm. In some embodiments, the polymer layer 24 has a thickness of 0.4 mm. In some embodiments, the polymer layer 24 has a thickness of 0.45 mm. In some embodiments, the polymer layer 24 has a thickness of 0.5 mm.

In some embodiments, a backsheet 28 is juxtaposed with a second layer 14b of the encapsulant 14. In some embodiments, the backsheet 28 includes a first layer 30. In some embodiments, the backsheet 28 includes a second layer 32. In some embodiments, the first layer 30 is juxtaposed with the second layer 14b of the encapsulant 14. In some embodiments, the second layer 32 is juxtaposed with the first layer 30. In some embodiments, the backsheet 28 only includes the first layer 30 (see FIG. 1B). In some embodiments, the photovoltaic module 10 does not include the backsheet 28.

In some embodiments, the first layer 30 of the backsheet 28 is composed of a polymeric material. In some embodiments, the first layer 30 of the backsheet 28 is composed of polyethylene terephthalate ("PET"). In some embodiments, the first layer 30 of the backsheet 28 is composed of an acrylic such as polymethyl methacrylate ("PMMA"). In some embodiments, the first layer 30 of the backsheet 28 is composed of thermoplastic polyolefin (TPO). In some embodiments, the first layer 30 of the backsheet 28 includes of a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the first layer 30 of the backsheet 28 is composed of polyvinyl chloride. In some embodiments, the first layer 30 of the backsheet 28 is composed of ethylene propylene diene monomer (EPDM) rubber. In some embodiments, the first layer 30 of the backsheet 28 is composed of polyvinyl chloride (PVC). In some embodiments, the first layer 30 of the backsheet 28 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the first layer 30 is white in color. In some embodiments, the first layer 30 is white TPO.

In some embodiments, the first layer 30 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), polytetrafluoroethylene (PTFE) and tetrafluoroethylene-hexafluoropropylenevinylidene fluoride copolymers (THV), polyvinyl fluoride (PVF), or blends thereof. In an embodiment, the first layer 30 is composed of fluoropolymers, acrylics, polyesters, silicones, polycarbonates, or combinations thereof. In other embodiments, the first layer 30 is composed of polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide.

In some embodiments, the first layer 30 is composed of cyclopiazonic acid (CPA), chlorinated polyethylene resins (CPE), ethylene interpolymers (EIP), nitrile butadiene polymers (NBP), polyisobutylenes (PIB), atactic-polypropylene (APP), APP-modified bitumen, poly(styrene-butadiene-styrene) (SBS), styrene ethylene butylene styrene (SEBS), chlorosulfonated polyethylene rubbers (CSPE), polychloroprene (CR), extracellular region membranes (ECR), polycarbonate, nylon, polyvinyl acetate, polystyrene, polyurethane, epoxy and the like.

In some embodiments, the polymeric material may comprise, consist of, or consist essentially of at least one thermoplastic polymer, at least one recycled polymer, or any combination thereof. In some embodiments, the at least one thermoplastic polymer may comprise, consist of, or consist essentially of a polyolefin, a vinyl polymer, or any combination thereof. In some embodiments, the polyolefin may comprise, consist of, or consist essentially of polyethylene, polypropylene, or any combination thereof, such as, for example and without limitation, a copolymer of ethylene and propylene. In some embodiments, the polyolefin may comprise, consist of, or consist essentially of a copolymer of ethylene and an alpha-olefin, such as, for example and without limitation, ethylene and 1-octene, ethylene and 1-hexene, and ethylene and 1-butene. In some embodiments, the vinyl polymer may comprise, consist of, or consist essentially of a polyvinyl ester. In some embodiments, the vinyl polymer may comprise, consist of, or consist essentially of polyvinyl butyral (PVB). In some embodiments, the thermoplastic polymer may comprise, consist of, or consist essentially of a thermoplastic elastomer.

Some non-limiting examples of the polymeric materials (e.g., such as, one or more of thermoplastic polymers, polyolefins, vinyl polymers, polyvinyl esters, thermoplastic elastomers, recycled polymers, etc.) may include, without limitation, one or more of the following: polyethylenes (PE) (e.g., including, without limitation, one or more of raw low density polyethylene, recycled low density polyethylene (LDPE), linear low density polyethylene (LLDPE), and high density polyethylene (HDPE)), polypropylene (PP) (e.g., including, without limitation, one or more of isotactic polypropylene (IPP), atactic polypropylene/isotactic propylene (APP/IPP)), polystyrene, polyurethane (PU/TPU), polyurea, terpolymers (e.g., including, without limitation, a functionalized polymer with a reactive oxygen group), amorphous polyalpha olefins (APAO), amorphous polyolefins (APO), (e.g., including, without limitation, one or more of propylene homopolymers, copolymers of propylene and ethylene, copolymers of ethylene alpha-olefin, such as ethylene and 1-octene, ethylene and 1-hexene, and ethylene and 1-butene), polyolefin elastomers (POE), styrene/styrenic block copolymers (e.g., including, without limitation, one or more of styrenic block copolymers with a hydrogenated midblock of styrene-ethylene/butylene-styrene (SEBS), styrene-ethylene/propylene-styrene (SEPS), styrene-isoprene-styrene block copolymers (SIS), and styrene-butadiene-styrene block copolymers (SBS)), ethylene vinyl acetate (EVA), polyisobutylene, polybutadiene, oxidized polyethylene, epoxy thermoplastics, raw polyvinyl butyral (PVB), recycled polyvinyl butyral (rPVB), polyvinyl acetate (PVAC), poly(vinyl butyrate), poly(vinyl propionate), poly (vinyl formate), and copolymers of PVAC (e.g., including, without limitation, copolymers of PVAC and EVA). Some non-limiting examples of the at least one polymer (e.g., including, without limitation, thermoplastic polymers, polyolefins, vinyl polymers, polyvinyl esters, and thermoplastic elastomers) may include, without limitation, one or more of the following: Vistamaxx® 6102 and Vistamaxx® 8880, which are polypropylenes (e.g., isotactic polypropylene (IPP)) and which are available from ExxonMobil, Irving, Tex.; Elvaloy®, which is a terpolymer and which is available from Dow/DuPont, Wilmington, Del.; Fusabond®, which is a chemically modified ethylene acrylate copolymer, a modified polyethylene, or a combination thereof and which is available from Dow/DuPont, Wilmington, Del.; RT2304, which is an amorphous polyalpha olefin (APAO) and which is available from Rextac APAO Polymers LLC, Odessa, Tex.; Eastoflex® P1023, which is an amorphous polyolefin (APO) comprising a propylene homopolymer and which is available from Eastman Chemical Company, Kingsport, Tenn.; Eastoflex® E1060, which is an amorphous polyolefin (APO) comprising a copolymer of propylene and ethylene and which is available from Eastman Chemical Company, Kingsport, Tenn.; Eastoflex® M1025, which is an amorphous polyolefin (APO) that comprises a blend of propylene homopolymer and copolymers of propylene and ethylene and which is available from Eastman Chemical Company, Kingsport, Tenn.; Engage® 7487, which is a polyolefin elastomer (POE) and which is available from Dow Inc., Midland, Mich.; SEBS 1657, which is a linear triblock copolymer based on styrene and ethylene/butylene, namely, styrene-ethylene/butylene-styrene (SEBS) and which is available Kraton™ Corporation, Houston, Tex.; D0243, D0246, D1101, D1102, D1116, D1118, D1152, D1155, D1157, D1184, D1189, D1191, and D1194, which are styrene butadiene styrene block copolymers comprising blocks of styrene and butadiene and which is available Kraton™ Corporation, Houston, Tex.; PI131350, which is a polyisobutylene and which is available from TPC Group, Houston, Tex.; ethylene bis stearamide (EBS), which is available from ACME-Hardesty Company, Blue Bell, Pa.; IPP, which is available from Bay Polymer Corp., Fremont, Calif.; and recycled low density polyethylene, which is available from Avangard Innovative, Houston, Tex.

In some embodiments, the first layer 30 includes a non-asphalt (NAS) roofing material. In an embodiment, the NAS material includes a thermoplastic polymer. In some embodiments, the thermoplastic polymer includes at least one of a polyolefin, a vinyl polymer, and combinations thereof. In some embodiments, the polyolefin comprises one of (i) a polypropylene, (ii) a polyethylene, or (iii) a copolymer of propylene and ethylene. In an embodiment, the vinyl polymer is polyvinyl butyral (PVB). In some embodiments, the NAS material includes a filler. In an embodiment, the filler includes at least one of an organic filler, an inorganic mineral filler, or combinations thereof. In an embodiment, the filler is at least one of calcium carbonate, barium sulfate, calcium sulfate, talc, limestone, perlite, silica, fumed silica, precipitated silica, quartz, aluminum trihydrate, magnesium hydroxide, colemanite, titanium dioxide, snow white, fly ash, graphene nanoparticles, carbon black, recycled rubber tires, recycled shingles, recycled thermoplastic resins, basalt, roofing granules, clay, and combinations thereof. In other embodiments, non-limiting examples of NAS materials are disclosed in U.S. Patent Application Publication No. 2020/0224419 to Boss et al., which is incorporated by reference herein in its entirety.

In some embodiments, the first layer 30 is composed of fiberglass. In some embodiments, the first layer 30 is composed of a polymer with fiberglass. In some embodiments, the first layer 30 is composed of a synthetic roofing material. In some embodiments, the synthetic roofing material is a polyolefin coated, woven product. In some embodiments, the polyolefin coated, woven product comprises polypropylene.

In some embodiments, the first layer 30 has a thickness of 0.2 mm to 0.5 mm. In another embodiment, the first layer 30 has a thickness of 0.2 mm to 0.4 mm. In another embodiment, the first layer 30 has a thickness of 0.2 mm to 0.3 mm. In some embodiments, the first layer 30 has a thickness of 0.3 mm to 0.5 mm. In another embodiment, the first layer 30 has a thickness of 0.3 mm to 0.4 mm. In some embodiments, the first layer 30 has a thickness of 0.4 mm to 0.5 mm. In some embodiments, the first layer 30 has a thickness of 0.2 mm. In some embodiments, the first layer 30 has a thickness of 0.3 mm. In some embodiments, the first layer 30 has a thickness of 0.4 mm. In some embodiments, the first layer 30 has a thickness of 0.5 mm.

In some embodiments, the second layer 32 of the backsheet 28 is composed of one or more of the materials described above with respect to the first layer 30 of the backsheet 28. In some embodiments, the second layer 32 is composed of the same material as the first layer 30. In some embodiments, the second layer 32 is composed of substantially the same material as the first layer 30. In some embodiments, the second layer 32 is composed of a different material than that of the first layer 30.

In some embodiments, the second layer 32 has a thickness of 1 mm to 5 mm. In some embodiments, the second layer 32 has a thickness of 1 mm to 4 mm. In some embodiments, the second layer 32 has a thickness of 1 mm to 3 mm. In some embodiments, the second layer 32 has a thickness of 1 mm to 2 mm. In some embodiments, the second layer 32 has a thickness of 2 mm to 5 mm. In some embodiments, the second layer 32 has a thickness of 2 mm to 4 mm. In some embodiments, the second layer 32 has a thickness of 2 mm to 3 mm. In some embodiments, the second layer 32 has a thickness of 3 mm to 5 mm. In some embodiments, the second layer 32 has a thickness of 3 mm to 4 mm. In some embodiments, the second layer 32 has a thickness of 4 mm to 5 mm. In some embodiments, the second layer 32 has a thickness of 1 mm. In some embodiments, the second layer 32 has a thickness of 2 mm. In some embodiments, the second layer 32 has a thickness of 3 mm. In some embodiments, the second layer 32 has a thickness of 4 mm. In some embodiments, the second layer 32 has a thickness of 5 mm.

In some embodiments, the first layer 30 is attached to the second layer 32 by a second adhesive layer 34. In some embodiments, the second adhesive layer 34 may include polyvinyl butyrate, acrylic, silicone, or polycarbonate. In another embodiment, the second adhesive layer 34 may include pressure sensitive adhesives.

In some embodiments, the second adhesive layer 34 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the second adhesive layer 34 has a thickness of 0.2 mm to 2 mm. In some embodiments, the second adhesive layer 34 has a thickness of 0.2 mm to 1.5 mm. In some embodiments, the second adhesive layer 34 has a thickness of 0.2 mm to 1 mm. In some embodiments, the second adhesive layer 34 has a thickness of 0.2 mm to 0.5 mm. In some embodiments, the second adhesive layer 34 has a thickness of 0.5 mm to 2 mm. In some embodiments, the second adhesive layer 34 has a thickness of 0.5 mm to 1.5 mm. In some embodiments, the second adhesive layer 34 has a thickness of 0.5 mm to 1 mm. In some embodiments, the second adhesive layer 34 has a thickness of 1 mm to 2 mm. In some embodiments, the second adhesive layer 34 has a thickness of 1 mm to 1.5 mm. In some embodiments, the second adhesive layer 34 has a thickness of 1.5 mm to 2 mm.

In some embodiments, the second adhesive layer 34 has a thickness of 0.2 mm. In some embodiments, the second adhesive layer 34 has a thickness of 0.3 mm. In some embodiments, the second adhesive layer 34 has a thickness of 0.4 mm. In some embodiments, the second adhesive layer 34 has a thickness of 0.45 mm. In some embodiments, the second adhesive layer 34 has a thickness of 0.5 mm. In some embodiments, the second adhesive layer 34 has a thickness of 1 mm. In some embodiments, the second adhesive layer 34 has a thickness of 1.5 mm. In some embodiments, the second adhesive layer 34 has a thickness of 2 mm. In some embodiments, the second adhesive layer 34 has a thickness of 2.5 mm. In some embodiments, the second adhesive layer 34 has a thickness of 3 mm. In some embodiments, the second adhesive layer 34 has a thickness of 3.5 mm. In some embodiments, the second adhesive layer 34 has a thickness of 4 mm.

In another embodiment, the second adhesive layer 34 has a thickness of 1 μm to 900 μm. In some embodiments, the second adhesive layer 34 has a thickness of 1 μm to 900 μm. In some embodiments, the second adhesive layer 34 has a thickness of 1 μm to 850 μm. In some embodiments, the second adhesive layer 34 has a thickness of 1 μm to 800 μm. In some embodiments, the second adhesive layer 34 has a thickness of 1 μm to 750 μm. In some embodiments, the second adhesive layer 34 has a thickness of 1 μm to 700 μm. In some embodiments, the second adhesive layer 34 has a thickness of 1 μm to 650 μm. In some embodiments, the second adhesive layer 34 has a thickness of 1 μm to 600 μm. In some embodiments, the second adhesive layer 34 has a thickness of 1 μm to 550 μm. In some embodiments, the second adhesive layer 34 has a thickness of 1 μm to 500 μm. In some embodiments, the second adhesive layer 34 has a thickness of 1 μm to 450 μm. In some embodiments, the second adhesive layer 34 has a thickness of 1 μm to 400 μm. In some embodiments, the second adhesive layer 34 has a thickness of 1 μm to 350 μm. In some embodiments, the second adhesive layer 34 has a thickness of 1 μm to 300 μm. In some embodiments, the second adhesive layer 34 has a thickness of 1 μm to 250 μm. In some embodiments, the second adhesive layer 34 has a thickness of 1 μm to 200 μm. In some embodiments, the second adhesive layer 34 has a thickness of 1 μm to 150 μm. In some embodiments, the second adhesive layer 34 has a thickness of 1 μm to 100 μm. In some embodiments, the second adhesive layer 34 has a thickness of 1 μm to 50 μm.

In some embodiments, the second adhesive layer 34 has a thickness of 50 μm to 900 μm. In some embodiments, the second adhesive layer 34 has a thickness of 50 μm to 850 μm. In some embodiments, the second adhesive layer 34 has a thickness of 50 μm to 800 μm. In some embodiments, the second adhesive layer 34 has a thickness of 50 μm to 750 μm. In some embodiments, the second adhesive layer 34 has a thickness of 50 μm to 700 μm. In some embodiments, the second adhesive layer 34 has a thickness of 50 μm to 650 μm. In some embodiments, the second adhesive layer 34 has a thickness of 50 μm to 600 μm. In some embodiments, the second adhesive layer 34 has a thickness of 50 μm to 550 μm. In some embodiments, the second adhesive layer 34 has a thickness of 50 μm to 500 μm. In some embodiments, the second adhesive layer 34 has a thickness of 50 μm to 450 μm. In some embodiments, the second adhesive layer 34 has a thickness of 50 μm to 400 μm. In some embodiments, the second adhesive layer 34 has a thickness of 50 μm to 350 μm. In some embodiments, the second adhesive layer 34 has a thickness of 50 μm to 300 μm. In some embodiments, the second adhesive layer 34 has a thickness of 50 μm to 250 μm. In some embodiments, the second adhesive layer 34 has a thickness of 50 μm to 200 μm. In some embodiments, the second adhesive layer 34 has a thickness of 50 μm to 150 μm. In some embodiments, the second adhesive layer 34 has a thickness of 50 μm to 100 μm.

In some embodiments, the second adhesive layer 34 has a thickness of 100 μm to 900 μm. In some embodiments, the second adhesive layer 34 has a thickness of 100 μm to 850 μm. In some embodiments, the second adhesive layer 34 has a thickness of 100 μm to 800 μm. In some embodiments, the second adhesive layer 34 has a thickness of 100 μm to 750 μm. In some embodiments, the second adhesive layer 34 has a thickness of 100 μm to 700 μm. In some embodiments, the second adhesive layer 34 has a thickness of 100 μm to 650 μm. In some embodiments, the second adhesive layer 34 has a thickness of 100 μm to 600 μm. In some embodiments, the second adhesive layer 34 has a thickness of 100 μm to 550 μm. In some embodiments, the second adhesive layer 34 has a thickness of 100 μm to 500 μm. In some embodiments, the second adhesive layer 34 has a thickness of 100 μm to 450 μm. In some embodiments, the second adhesive layer 34 has a thickness of 100 μm to 400 μm. In some embodiments, the second adhesive layer 34 has a thickness of 100 μm to 350 μm. In some embodiments, the second adhesive layer 34 has a thickness of 100 μm to 300 μm. In some embodiments, the second adhesive layer 34 has a thickness of 100 μm to 250 μm. In some embodiments, the second adhesive layer 34 has a thickness of 100 μm to 200 μm. In some embodiments, the second adhesive layer 34 has a thickness of 100 μm to 150 μm.

In some embodiments, the second adhesive layer 34 has a thickness of 150 μm to 900 μm. In some embodiments, the second adhesive layer 34 has a thickness of 150 μm to 850 μm. In some embodiments, the second adhesive layer 34 has a thickness of 150 μm to 800 μm. In some embodiments, the second adhesive layer 34 has a thickness of 150 μm to 750 μm. In some embodiments, the second adhesive layer 34 has a thickness of 150 μm to 700 μm. In some embodiments, the second adhesive layer 34 has a thickness of 150 μm to 650 μm. In some embodiments, the second adhesive layer 34 has a thickness of 150 μm to 600 μm. In some embodiments, the second adhesive layer 34 has a thickness of 150 μm to 550 μm. In some embodiments, the second adhesive layer 34 has a thickness of 150 μm to 500 μm. In some embodiments, the second adhesive layer 34 has a thickness of 150 μm to 450 μm. In some embodiments, the second adhesive layer 34 has a thickness of 150 μm to 400 μm. In some embodiments, the second adhesive layer 34 has a thickness of 150 μm to 350 μm. In some embodiments, the second adhesive layer 34 has a thickness of 150 μm to 300 μm. In some embodiments, the second adhesive layer 34 has a thickness of 150 μm to 250 μm. In some embodiments, the second adhesive layer 34 has a thickness of 150 μm to 200 μm.

In some embodiments, the second adhesive layer 34 has a thickness of 200 μm to 900 μm. In some embodiments, the second adhesive layer 34 has a thickness of 200 μm to 850 μm. In some embodiments, the second adhesive layer 34 has a thickness of 200 μm to 800 μm. In some embodiments, the second adhesive layer 34 has a thickness of 200 μm to 750 μm. In some embodiments, the second adhesive layer 34 has a thickness of 200 μm to 700 μm. In some embodiments, the second adhesive layer 34 has a thickness of 200 μm to 650 μm. In some embodiments, the second adhesive layer 34 has a thickness of 200 μm to 600 μm. In some embodiments, the second adhesive layer 34 has a thickness of 200 μm to 550 μm. In some embodiments, the second adhesive layer 34 has a thickness of 200 μm to 500 μm. In some embodiments, the second adhesive layer 34 has a thickness of 200 μm to 450 μm. In some embodiments, the second adhesive layer 34 has a thickness of 200 μm to 400 μm. In some embodiments, the second adhesive layer 34 has a thickness of 200 μm to 350 μm. In some embodiments, the second adhesive layer 34 has a thickness of 200 μm to 300 μm. In some embodiments, the second adhesive layer 34 has a thickness of 200 μm to 250 μm.

In some embodiments, the second adhesive layer 34 has a thickness of 250 μm to 900 μm. In some embodiments, the second adhesive layer 34 has a thickness of 250 μm to 850 μm. In some embodiments, the second adhesive layer 34 has a thickness of 250 μm to 800 μm. In some embodiments, the second adhesive layer 34 has a thickness of 250 μm to 750 μm. In some embodiments, the second adhesive layer 34 has a thickness of 250 μm to 700 μm. In some embodiments, the second adhesive layer 34 has a thickness of 250 μm to 650 μm. In some embodiments, the second adhesive layer 34 has a thickness of 250 μm to 600 μm. In some embodiments, the second adhesive layer 34 has a thickness of 250 μm to 550 μm. In some embodiments, the second adhesive layer 34 has a thickness of 250 μm to 500 μm. In some embodiments, the second adhesive layer 34 has a thickness of 250 μm to 450 μm. In some embodiments, the second adhesive layer 34 has a thickness of 250 μm to 400 μm. In some embodiments, the second adhesive layer 34 has a thickness of 250 μm to 350 μm. In some embodiments, the second adhesive layer 34 has a thickness of 250 μm to 300 μm.

In some embodiments, the second adhesive layer 34 has a thickness of 300 μm to 900 μm. In some embodiments, the second adhesive layer 34 has a thickness of 300 μm to 850 μm. In some embodiments, the second adhesive layer 34 has a thickness of 300 μm to 800 μm. In some embodiments, the second adhesive layer 34 has a thickness of 300 μm to 750 μm. In some embodiments, the second adhesive layer 34 has a thickness of 300 μm to 700 μm. In some embodiments, the second adhesive layer 34 has a thickness of 300 μm to 650 μm. In some embodiments, the second adhesive layer 34 has a thickness of 300 μm to 600 μm. In some embodiments, the second adhesive layer 34 has a thickness of 300 μm to 550 μm. In some embodiments, the second adhesive layer 34 has a thickness of 300 μm to 500 μm. In some embodiments, the second adhesive layer 34 has a thickness of 300 μm to 450 μm. In some embodiments, the second adhesive layer 34 has a thickness of 300 μm to 400 μm. In some embodiments, the second adhesive layer 34 has a thickness of 300 μm to 350 μm.

In some embodiments, the second adhesive layer 34 has a thickness of 350 μm to 900 μm. In some embodiments, the second adhesive layer 34 has a thickness of 350 μm to 850 μm. In some embodiments, the second adhesive layer 34 has a thickness of 350 μm to 800 μm. In some embodiments, the second adhesive layer 34 has a thickness of 350 μm to 750

μm. In some embodiments, the second adhesive layer 34 has a thickness of 350 μm to 700 μm. In some embodiments, the second adhesive layer 34 has a thickness of 350 μm to 650 μm. In some embodiments, the second adhesive layer 34 has a thickness of 350 μm to 600 μm. In some embodiments, the second adhesive layer 34 has a thickness of 350 μm to 550 μm. In some embodiments, the second adhesive layer 34 has a thickness of 350 μm to 500 μm. In some embodiments, the second adhesive layer 34 has a thickness of 350 μm to 450 μm. In some embodiments, the second adhesive layer 34 has a thickness of 350 μm to 400 μm.

In some embodiments, the second adhesive layer 34 has a thickness of 400 μm to 900 μm. In some embodiments, the second adhesive layer 34 has a thickness of 400 μm to 850 μm. In some embodiments, the second adhesive layer 34 has a thickness of 400 μm to 800 μm. In some embodiments, the second adhesive layer 34 has a thickness of 400 μm to 750 μm. In some embodiments, the second adhesive layer 34 has a thickness of 400 μm to 700 μm. In some embodiments, the second adhesive layer 34 has a thickness of 400 μm to 650 μm. In some embodiments, the second adhesive layer 34 has a thickness of 400 μm to 600 μm. In some embodiments, the second adhesive layer 34 has a thickness of 400 μm to 550 μm. In some embodiments, the second adhesive layer 34 has a thickness of 400 μm to 500 μm. In some embodiments, the second adhesive layer 34 has a thickness of 400 μm to 450 μm.

In some embodiments, the second adhesive layer 34 has a thickness of 450 μm to 900 μm. In some embodiments, the second adhesive layer 34 has a thickness of 450 μm to 850 μm. In some embodiments, the second adhesive layer 34 has a thickness of 450 μm to 800 μm. In some embodiments, the second adhesive layer 34 has a thickness of 450 μm to 750 μm. In some embodiments, the second adhesive layer 34 has a thickness of 450 μm to 700 μm. In some embodiments, the second adhesive layer 34 has a thickness of 450 μm to 650 μm. In some embodiments, the second adhesive layer 34 has a thickness of 450 μm to 600 μm. In some embodiments, the second adhesive layer 34 has a thickness of 450 μm to 550 μm. In some embodiments, the second adhesive layer 34 has a thickness of 450 μm to 500 μm.

In some embodiments, the second adhesive layer 34 has a thickness of 500 μm to 900 μm. In some embodiments, the second adhesive layer 34 has a thickness of 500 μm to 850 μm. In some embodiments, the second adhesive layer 34 has a thickness of 500 μm to 800 μm. In some embodiments, the second adhesive layer 34 has a thickness of 500 μm to 750 μm. In some embodiments, the second adhesive layer 34 has a thickness of 500 μm to 700 μm. In some embodiments, the second adhesive layer 34 has a thickness of 500 μm to 650 μm. In some embodiments, the second adhesive layer 34 has a thickness of 500 μm to 600 μm. In some embodiments, the second adhesive layer 34 has a thickness of 500 μm to 550 μm.

In some embodiments, the second adhesive layer 34 has a thickness of 550 μm to 900 μm. In some embodiments, the second adhesive layer 34 has a thickness of 550 μm to 850 μm. In some embodiments, the second adhesive layer 34 has a thickness of 550 μm to 800 μm. In some embodiments, the second adhesive layer 34 has a thickness of 550 μm to 750 μm. In some embodiments, the second adhesive layer 34 has a thickness of 550 μm to 700 μm. In some embodiments, the second adhesive layer 34 has a thickness of 550 μm to 650 μm. In some embodiments, the second adhesive layer 34 has a thickness of 550 μm to 600 μm.

In some embodiments, the second adhesive layer 34 has a thickness of 600 μm to 900 μm. In some embodiments, the second adhesive layer 34 has a thickness of 600 μm to 850 μm. In some embodiments, the second adhesive layer 34 has a thickness of 600 μm to 800 μm. In some embodiments, the second adhesive layer 34 has a thickness of 600 μm to 750 μm. In some embodiments, the second adhesive layer 34 has a thickness of 600 μm to 700 μm. In some embodiments, the second adhesive layer 34 has a thickness of 600 μm to 650 μm.

In some embodiments, the second adhesive layer 34 has a thickness of 650 μm to 900 μm. In some embodiments, the second adhesive layer 34 has a thickness of 650 μm to 850 μm. In some embodiments, the second adhesive layer 34 has a thickness of 650 μm to 800 μm. In some embodiments, the second adhesive layer 34 has a thickness of 650 μm to 750 μm. In some embodiments, the second adhesive layer 34 has a thickness of 650 μm to 700 μm. In some embodiments, the second adhesive layer 34 has a thickness of 700 μm to 900 μm. In some embodiments, the second adhesive layer 34 has a thickness of 700 μm to 850 μm. In some embodiments, the second adhesive layer 34 has a thickness of 700 μm to 800 μm. In some embodiments, the second adhesive layer 34 has a thickness of 700 μm to 750 μm. In some embodiments, the second adhesive layer 34 has a thickness of 750 μm to 900 μm. In some embodiments, the second adhesive layer 34 has a thickness of 750 μm to 850 μm. In some embodiments, the second adhesive layer 34 has a thickness of 750 μm to 800 μm. In some embodiments, the second adhesive layer 34 has a thickness of 800 μm to 900 μm. In some embodiments, the second adhesive layer 34 has a thickness of 800 μm to 850 μm. In some embodiments, the second adhesive layer 34 has a thickness of 850 μm to 900 μm.

In some embodiments, the second adhesive layer 34 has a thickness of 1 μm. In some embodiments, the second adhesive layer 34 has a thickness of 50 μm. In some embodiments, the second adhesive layer 34 has a thickness of 100 μm. In some embodiments, the second adhesive layer 34 has a thickness of 1 μm. In some embodiments, the second adhesive layer 34 has a thickness of 150 μm. In some embodiments, the second adhesive layer 34 has a thickness of 200 μm. In some embodiments, the second adhesive layer 34 has a thickness of 250 μm. In some embodiments, the second adhesive layer 34 has a thickness of 300 μm. In some embodiments, the second adhesive layer 34 has a thickness of 350 μm. In some embodiments, the second adhesive layer 34 has a thickness of 400 μm. In some embodiments, the second adhesive layer 34 has a thickness of 450 μm. In some embodiments, the second adhesive layer 34 has a thickness of 500 μm. In some embodiments, the second adhesive layer 34 has a thickness of 550 μm. In some embodiments, the second adhesive layer 34 has a thickness of 600 μm. In some embodiments, the second adhesive layer 34 has a thickness of 650 μm. In some embodiments, the second adhesive layer 34 has a thickness of 700 μm. In some embodiments, the second adhesive layer 34 has a thickness of 750 μm. In some embodiments, the second adhesive layer 34 has a thickness of 800 μm. In some embodiments, the second adhesive layer 34 has a thickness of 850 μm. In some embodiments, the second adhesive layer 34 has a thickness of 900 μm.

In another embodiment, the first layer 30 is attached to the second layer 32 by thermal bonding.

Referring to FIGS. 2A through 4, in some embodiments, the backsheet 28 includes a head flap 40. In some embodiments, the head flap 40 is located at a first end 42 of the photovoltaic module 10. In some embodiments, the backsheet 28 includes a bottom flap 44 located at a second end 46 of the photovoltaic module 10. In some embodiments, the bottom flap 44 is located opposite the head flap 40. In some embodiments, the backsheet 28 includes a first side flap 48. In some embodiments, the first side flap 48 is located at a first side 50 of the photovoltaic module 10. In some embodiments, the first side flap 48 extends from the first end 42 to the second end 46. In some embodiments, the first side flap 48 extends from the head flap 40 to the bottom flap 44. In some embodiments, the backsheet 28 includes a second side flap 52. In some embodiments, the second side flap 52 is located at a second side 54 of the photovoltaic module 10. In some embodiments, the second side flap 52 extends from the first end 42 to the second end 46. In some embodiments, the second side flap 52 extends from the head flap 40 to the bottom flap 44. In some embodiments, the head flap 40, the bottom flap 44, the first side flap 48 and the second side flap 52 are unitary with the backsheet 28.

Figure 2A:
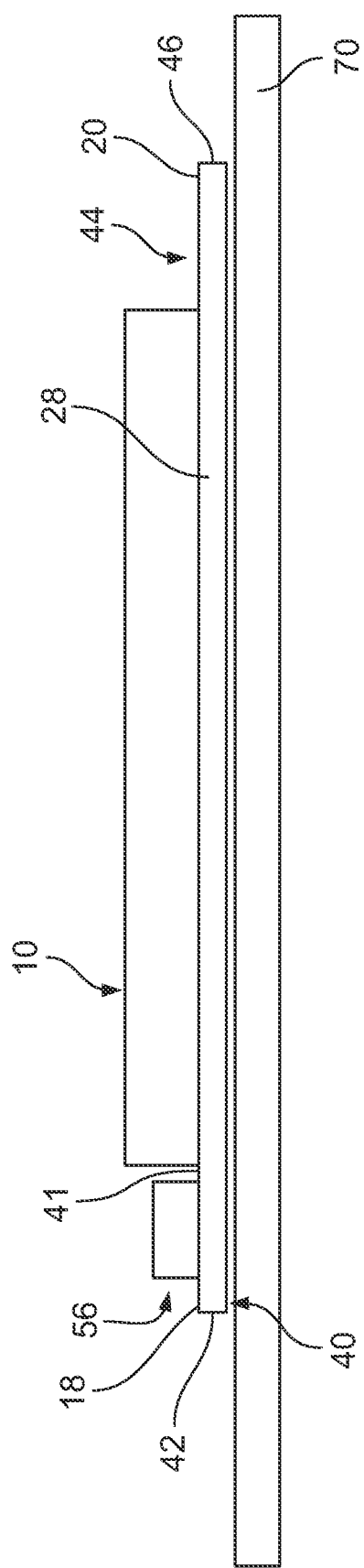
FIG. 2A is a side elevational view of some embodiments of a photovoltaic module attached to a roof.
Figure 2B:
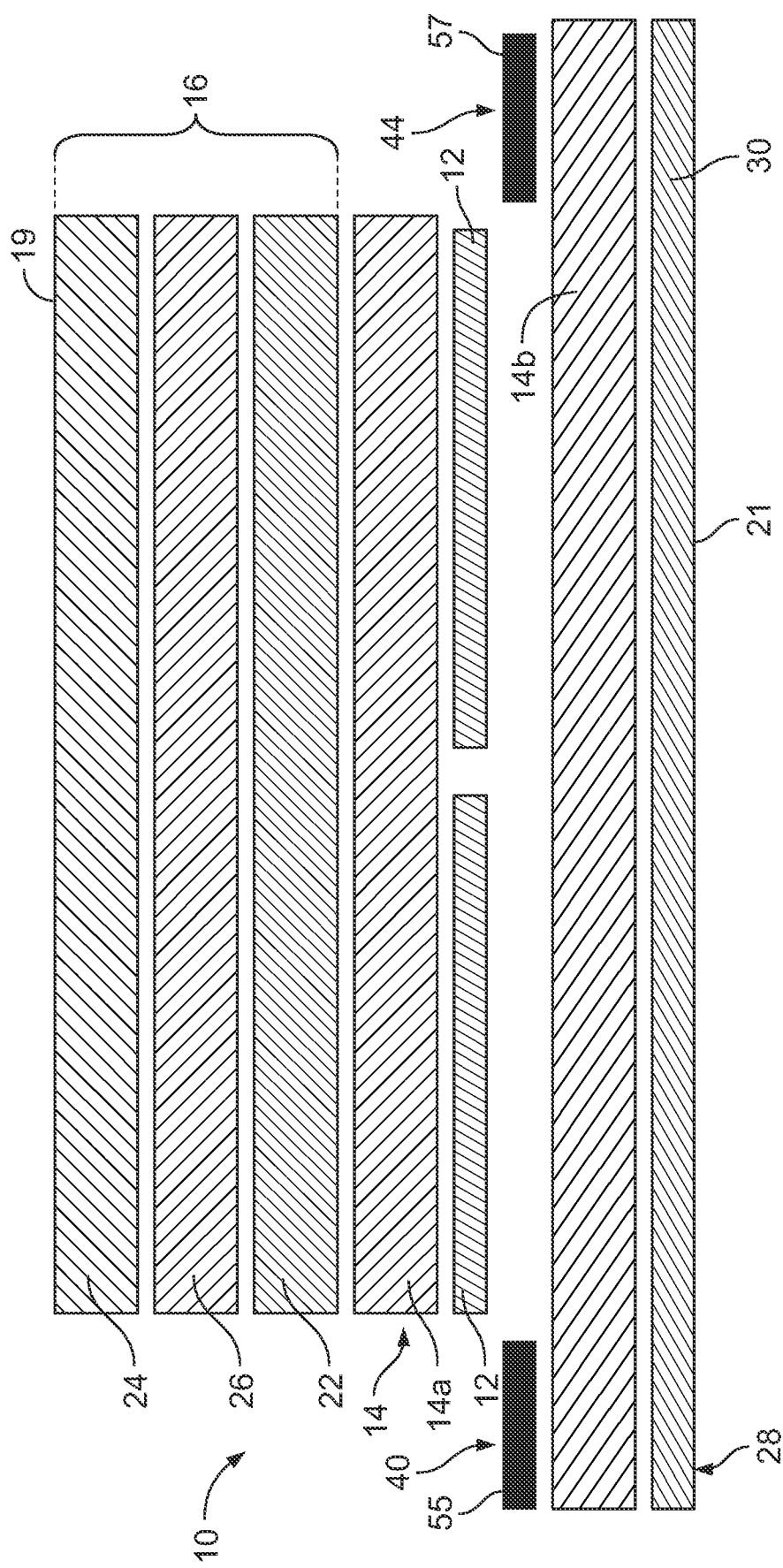
FIG. 2B is a schematic view of some embodiments of a photovoltaic module.
Figure 7:
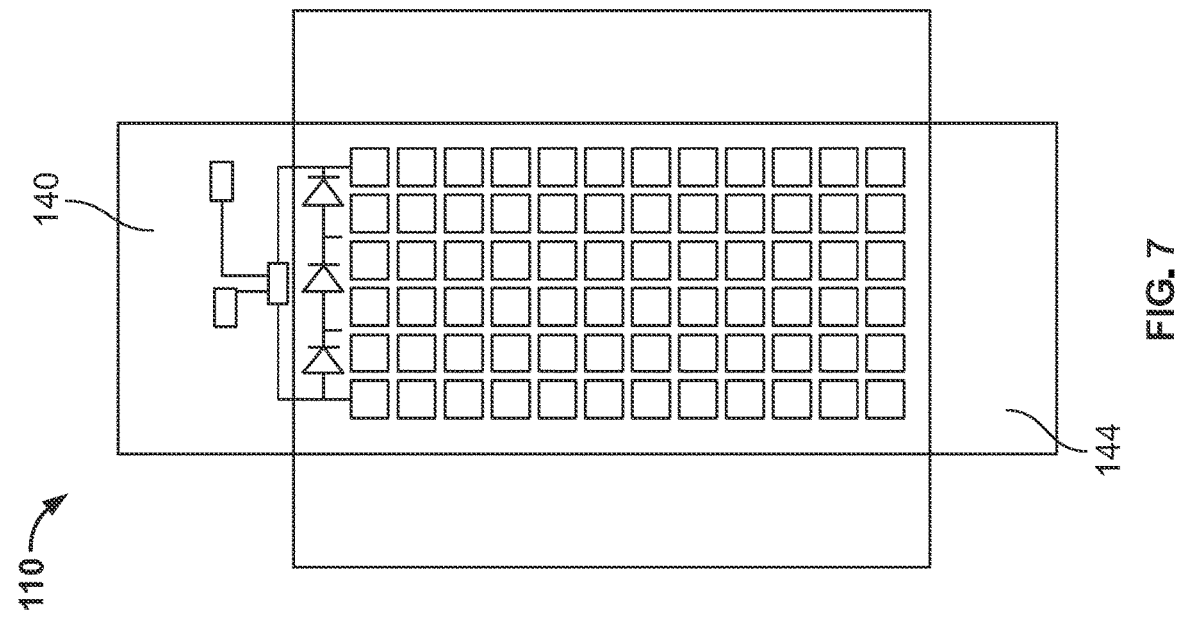
FIG. 7 is a top plan view of the photovoltaic module shown in FIG. 6, but including an electrical connector.
Figure 6:
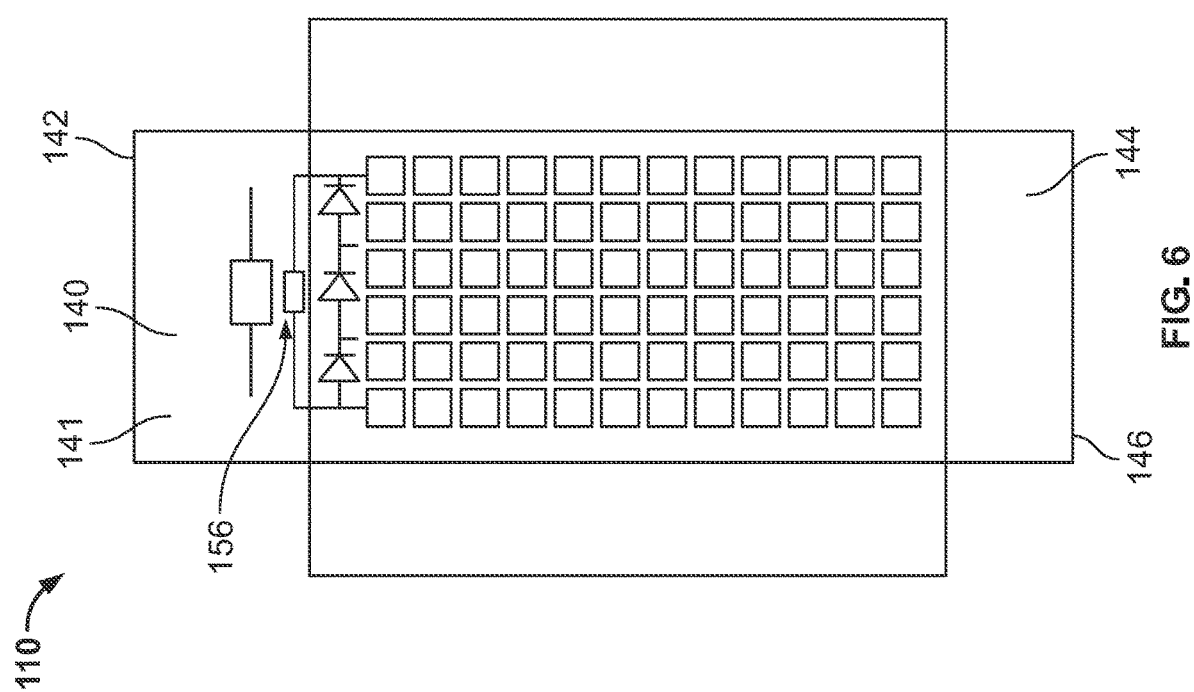
FIG. 6 is a top plan view of the photovoltaic module shown in FIG. 5A.

Referring to FIG. 2B, in some embodiments, the head flap 40 includes a polymer layer 55. In some embodiments, the polymer layer 55 is juxtaposed with the second layer 14b of the encapsulant 14. In some embodiments, the bottom flap 44 includes a polymer layer 57. In some embodiments, the polymer layer 57 is juxtaposed with the second layer 14b of the encapsulant 14. In some embodiments, each of the polymer layers 55, 57 is composed of a polymeric material. In some embodiments, each of the polymer layers 55, 57 is composed of polyethylene terephthalate ("PET"). In some embodiments, each of the polymer layers 55, 57 is composed of ethylene tetrafluoroethylene ("ETFE"). In some embodiments, each of the polymer layers 55, 57 is composed of an acrylic such as polymethyl methacrylate ("PMMA"). In some embodiments, each of the polymer layers 55, 57 is composed of thermoplastic polyolefin (TPO). In some embodiments, each of the polymer layers 55, 57 is composed of polyvinyl chloride. In some embodiments, each of the polymer layers 55, 57 is composed of ethylene propylene diene monomer (EPDM) rubber. In some embodiments, each of the polymer layers 55, 57 is composed of HZF aramid reinforced polyamide.

In some embodiments, the polymer layer 55 has a thickness of 0.2 mm to 0.5 mm. In another embodiment, the polymer layer 55 has a thickness of 0.2 mm to 0.4 mm. In another embodiment, the polymer layer 55 has a thickness of 0.2 mm to 0.3 mm. In some embodiments, the polymer layer 55 has a thickness of 0.3 mm to 0.5 mm. In another embodiment, the polymer layer 55 has a thickness of 0.3 mm to 0.4 mm. In some embodiments, the polymer layer 55 has a thickness of 0.4 mm to 0.5 mm. In some embodiments, the polymer layer 55 has a thickness of 0.2 mm. In some embodiments, the polymer layer 55 has a thickness of 0.3 mm. In some embodiments, the polymer layer 55 has a thickness of 0.4 mm. In some embodiments, the polymer layer 55 has a thickness of 0.5 mm.

In some embodiments, the polymer layer 57 has a thickness of 0.2 mm to 0.5 mm. In another embodiment, the polymer layer 57 has a thickness of 0.2 mm to 0.4 mm. In another embodiment, the polymer layer 57 has a thickness of 0.2 mm to 0.3 mm. In some embodiments, the polymer layer 57 has a thickness of 0.3 mm to 0.5 mm. In another embodiment, the polymer layer 57 has a thickness of 0.3 mm to 0.4 mm. In some embodiments, the polymer layer 57 has a thickness of 0.4 mm to 0.5 mm. In some embodiments, the polymer layer 57 has a thickness of 0.2 mm. In some embodiments, the polymer layer 57 has a thickness of 0.3 mm. In some embodiments, the polymer layer 57 has a thickness of 0.4 mm. In some embodiments, the polymer layer 57 has a thickness of 0.5 mm.

In some embodiments, the photovoltaic module 10 is configured to be attached to a roofing membrane 70 of a roof deck. In some embodiments, the roof deck is a component of a commercial roof. In some embodiments, the roof deck has a slope of 3 inches per foot or less. In some embodiments, the roof deck has a slope of 0.25 inch to 3 inches per foot. In some embodiments, the roof deck has a slope of 0.25 inch to 2 inches per foot. In some embodiments, the roof deck has a slope of 0.25 inch to 1 inch per foot. In some embodiments, the roof deck has a slope of 1 inch to 3 inches per foot. In some embodiments, the roof deck has a slope of 1 inch to 2 inches per foot. In some embodiments, the roof deck has a slope of 2 inches to 3 inches per foot.

In some embodiments, the roof deck is a steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof.

In some embodiments, the roofing membrane 70 is a preexisting roofing membrane installed on the roof deck. In some embodiments, an upper, outermost surface of the roofing membrane 70 opposite the roof deck is cleaned by a cleaning process.

In some embodiments, the head flap 40 is attached to the roofing membrane 70. In some embodiments, the bottom flap 44 is attached to the roofing membrane 70. In some embodiments, the first side flap 48 is attached to the roofing membrane 70. In some embodiments, the second side flap 52 is attached to the roofing membrane 70. In some embodiments, each of the first side flap 48 and the second side flap 52 is configured to prevent wind uplift. In an embodiment, the roofing membrane 70 is made from a polymeric material. In some embodiments, the roofing membrane 70 is composed of polyethylene terephthalate ("PET"). In another embodiment, the roofing membrane 70 is composed of ethylene tetrafluoroethylene ("ETFE"). In some embodiments, the roofing membrane 70 is composed of an acrylic such as polymethyl methacrylate ("PMMA"). In some embodiments, the roofing membrane 70 is composed of thermoplastic polyolefin (TPO). In some embodiments, the roofing membrane 70 is composed of polyvinyl chloride. In some embodiments, the roofing membrane 70 is composed of ethylene propylene diene monomer (EPDM) rubber. In some embodiments, the photovoltaic module 10 is attached to the roofing membrane 70 by an adhesive. In some embodiments, the adhesive is a peel and stick film sheet. In some embodiments, the peel and stick film sheet includes at least one sheet of film removably attached to a rear, lower most surface of the photovoltaic module 10. In some embodiments, the peel and stick film sheet is composed of EverGuard Freedom HW peel and stick membrane manufactured by GAF. In some embodiments, the adhesive includes polyvinyl butyrate, acrylic, silicone, or polycarbonate. In some embodiments, the adhesive includes pressure sensitive adhesives. In some embodiments, the photovoltaic module 10 is attached to the roofing membrane 70 by thermal bonding. In some embodiments, the photovoltaic module 10 is attached to the roofing membrane 70 by ultrasonic welding. In some embodiments, the photovoltaic module 10 is attached to the roofing membrane 70 by heat welding. In some embodiments, the photovoltaic module 10 is attached to the roofing membrane 70 by induction welding. In some embodiments, the photovoltaic module 10 is attached to the roofing membrane 70 by hot air welding. In some embodiments, the photovoltaic module 10 is attached to the roofing membrane 70 by a mechanical crimping. In some embodiments, the photovoltaic module 10 is attached to the roofing membrane 70 by at least one fastener. In some embodiments, the at least one fastener includes a plurality of the fasteners. In some embodiments, the at least one fastener includes a nail. In some embodiments, the at least one fastener includes a screw. In some embodiments, the at least one fastener includes a rivet. In some embodiments, the at least one fastener includes a staple.

In some embodiments, a width W1 of the head flap 40 is 1 inch to 50 inches. In some embodiments, the width W1 of the head flap 40 is 1 inch to 40 inches. In some embodiments, the width W1 of the head flap 40 is 1 inch to 30 inches. In some embodiments, the width W1 of the head flap 40 is 1 inch to 20 inches. In some embodiments, the width W1 of the head flap 40 is 1 inch to 10 inches. In some embodiments, the width W1 of the head flap 40 is 10 inches to 50 inches. In some embodiments, the width W1 of the head flap 40 is 10 inches to 40 inches. In some embodiments, the width W1 of the head flap 40 is 10 inches to 30 inches. In some embodiments, the width W1 of the head flap 40 is 10 inches to 20 inches. In some embodiments, the width W1 of the head flap 40 is 20 inches to 50 inches. In some embodiments, the width W1 of the head flap 40 is 20 inches to 40 inches. In some embodiments, the width W1 of the head flap 40 is 20 inches to 30 inches. In some embodiments, the width W1 of the head flap 40 is 30 inches to 50 inches. In some embodiments, the width W1 of the head flap 40 is 30 inches to 40 inches. In some embodiments, the width W1 of the head flap 40 is 40 inches to 50 inches. In some embodiments, the width W1 of the head flap 40 is 1 inch. In some embodiments, the width W1 of the head flap 40 is 10 inches. In some embodiments, the width W1 of the head flap 40 is 20 inches. In some embodiments, the width W1 of the head flap 40 is 30 inches. In some embodiments, the width W1 of the head flap 40 is 40 inches. In some embodiments, the width W1 of the head flap 40 is 50 inches.

In some embodiments, a width W2 of the bottom flap 44 is 1 inch to 50 inches. In some embodiments, the width W2 of the bottom flap 44 is 1 inch to 40 inches. In some embodiments, the width W2 of the bottom flap 44 is 1 inch to 30 inches. In some embodiments, the width W2 of the bottom flap 44 is 1 inch to 20 inches. In some embodiments, the width W2 of the bottom flap 44 is 1 inch to 10 inches. In some embodiments, the width W2 of the bottom flap 44 is 10 inches to 50 inches. In some embodiments, the width W2 of the bottom flap 44 is 10 inches to 40 inches. In some embodiments, the width W2 of the bottom flap 44 is 10 inches to 30 inches. In some embodiments, the width W2 of the bottom flap 44 is 10 inches to 20 inches. In some embodiments, the width W2 of the bottom flap 44 is 20 inches to 50 inches. In some embodiments, the width W2 of the bottom flap 44 is 20 inches to 40 inches. In some embodiments, the width W2 of the bottom flap 44 is 20 inches to 30 inches. In some embodiments, the width W2 of the bottom flap 44 is 30 inches to 50 inches. In some embodiments, the width W2 of the bottom flap 44 is 30 inches to 40 inches. In some embodiments, the width W2 of the bottom flap 44 is 40 inches to 50 inches. In some embodiments, the width W2 of the bottom flap 44 is 1 inch. In some embodiments, the width W2 of the bottom flap 44 is 10 inches. In some embodiments, the width W2 of the bottom flap 44 is 20 inches. In some embodiments, the width W2 of the bottom flap 44 is 30 inches. In some embodiments, the width W2 of the bottom flap 44 is 40 inches. In some embodiments, the width W2 of the bottom flap 44 is 50 inches.

In some embodiments, a width W3 of the first side flap 48 is 1 inch to 50 inches. In some embodiments, the width W3 of the first side flap 48 is 1 inch to 40 inches. In some embodiments, the width W3 of the first side flap 48 is 1 inch to 30 inches. In some embodiments, the width W3 of the first side flap 48 is 1 inch to 20 inches. In some embodiments, the width W3 of the first side flap 48 is 1 inch to 10 inches. In some embodiments, the width W3 of the first side flap 48 is 10 inches to 50 inches. In some embodiments, the width W3 of the first side flap 48 is 10 inches to 40 inches. In some embodiments, the width W3 of the first side flap 48 is 10 inches to 30 inches. In some embodiments, the width W3 of the first side flap 48 is 10 inches to 20 inches. In some embodiments, the width W3 of the first side flap 48 is 20 inches to 50 inches. In some embodiments, the width W3 of the first side flap 48 is 20 inches to 40 inches. In some embodiments, the width W3 of the first side flap 48 is 20 inches to 30 inches. In some embodiments, the width W3 of the first side flap 48 is 30 inches to 50 inches. In some embodiments, the width W3 of the first side flap 48 is 30 inches to 40 inches. In some embodiments, the width W3 of the first side flap 48 is 40 inches to 50 inches. In some embodiments, the width W3 of the first side flap 48 is 1 inch. In some embodiments, the width W3 of the first side flap 48 is 10 inches. In some embodiments, the width W3 of the first side flap 48 is 20 inches. In some embodiments, the width W3 of the first side flap 48 is 30 inches. In some embodiments, the width W3 of the first side flap 48 is 40 inches. In some embodiments, the width W3 of the first side flap 48 is 50 inches.

In some embodiments, a width W4 of the second side flap 52 is 1 inch to 50 inches. In some embodiments, the width W4 of the second side flap 52 is 1 inch to 40 inches. In some embodiments, the width W4 of the second side flap 52 is 1 inch to 30 inches. In some embodiments, the width W4 of the second side flap 52 is 1 inch to 20 inches. In some embodiments, the width W4 of the second side flap 52 is 1 inch to 10 inches. In some embodiments, the width W4 of the second side flap 52 is 10 inches to 50 inches. In some embodiments, the width W4 of the second side flap 52 is 10 inches to 40 inches. In some embodiments, the width W4 of the second side flap 52 is 10 inches to 30 inches. In some embodiments, the width W4 of the second side flap 52 is 10 inches to 20 inches. In some embodiments, the width W4 of the second side flap 52 is 20 inches to 50 inches. In some embodiments, the width W4 of the second side flap 52 is 20 inches to 40 inches. In some embodiments, the width W4 of the second side flap 52 is 20 inches to 30 inches. In some embodiments, the width W4 of the second side flap 52 is 30 inches to 50 inches. In some embodiments, the width W4 of the second side flap 52 is 30 inches to 40 inches. In some embodiments, the width W4 of the second side flap 52 is 40 inches to 50 inches. In some embodiments, the width W4 of the second side flap 52 is 1 inch. In some embodiments, the width W4 of the second side flap 52 is 10 inches. In some embodiments, the width W4 of the second side flap 52 is 20 inches. In some embodiments, the width W4 of the second side flap 52 is 30 inches. In some embodiments, the width W4 of the second side flap 52 is 40 inches. In some embodiments, the width W4 of the second side flap 52 is 50 inches.

In some embodiments, at least a portion of the head flap 40 is attached to the roofing membrane 70. In some embodiments, a width of 1 inch to 2 inches of the head flap 40 is attached to the roofing membrane 70. In some embodiments, at least a portion of the bottom flap 44 is attached to the roofing membrane 70. In some embodiments, a width of 1 inch to 2 inches of the bottom flap 44 is attached to the roofing membrane 70. In some embodiments, the first side flap 48 is attached to the roofing membrane 70. In some embodiments, a width of 1 inch to 2 inches of the first side flap 48 is attached to the roofing membrane 70. In some embodiments, the second side flap 52 is attached to the roofing membrane 70. In some embodiments, a width of 1 inch to 2 inches of the second side flap 52 is attached to the roofing membrane 70.

In some embodiments, the photovoltaic module 10 includes at least one junction box 56. In some embodiments, the at least one junction box 56 is located on a first surface 41 of the head flap 40. In some embodiments, the at least one junction box 56 is attached to the first surface 41 of the head flap 40. In some embodiments, the polymer layer 55 includes the first surface 41. In some embodiments, the at least one junction box 56 is laminated within the head flap 40. In some embodiments, the at least one junction box 56 is encapsulated within the encapsulant 14. In some embodiments, the photovoltaic module 10 includes at least one module level power electronic component 58. In some embodiments, the at least one module level power electronic component 58 is located on the first surface 41 of the head flap 40. In some embodiments, the at least one module level power electronic component 58 is attached to the first surface 41 of the head flap 40. In some embodiments, the at least one module level power electronic component 58 is laminated within the head flap 40. In some embodiments, the photovoltaic module 10 includes at least one electrical connector 60. In some embodiments, the photovoltaic module 10 includes at least one electrical connector 60. In some embodiments, the at least one electrical connector 60 is a low profile electrical connector. In some embodiments, the at least one electrical connector 60 has a thickness of 1 mm to 10 mm. In some embodiments, the at least one electrical connector 60 is a flat ribbon cable. In some embodiments, the at least one electrical connector 60 is attached to the first surface 41 of the head flap 40. In some embodiments, the at least one electrical connector 60 is laminated within the head flap 40. In some embodiments, the photovoltaic module 10 includes at least one diode 62. In some embodiments, the at least one diode 62 is laminated within the encapsulant 14.

In some embodiments, the photovoltaic module 10 is configured (e.g., sized, shaped, positioned, made using a suitable material, etc.) such that it passes the UL 7103 standard for walkability (e.g., a "200 pound roofer test"). This test involves attaching the photovoltaic module 10 to a representative model of a roof and setting a 200-pound weight on a 3-inch diameter puck on the photovoltaic module 10 for 30 minutes. A photovoltaic module is deemed to pass the UL 7103 standard if there are no penetrations at the end of the 30-minute time period.

FIGS. 5A through 7 show an embodiment of a photovoltaic module 110. In some embodiments, the photovoltaic module 110 includes a structure and function similar to those of the photovoltaic module 10, except for certain differences provided herein. In some embodiments, the photovoltaic module 110 includes a head flap 140 located at a first end 142 of the photovoltaic module 110 and a bottom flap 144 located at a second end 146 of the photovoltaic module 110. In some embodiments, the head flap 140 incudes a first surface 141 and a second surface 143 opposite the first surface 141. In some embodiments, the bottom flap 144 includes a first surface 145 and a second surface 147 opposite the first surface 145.

In some embodiments, a free end 148 of the head flap 140 is bent and folded relative to itself such that it forms a rounded end 149. In some embodiments, the head flap 140 includes one fold. In some embodiments, the rounded end 149 includes a first portion 151 juxtaposed with the roofing membrane 170 and a second portion 153 that is distal from the roofing membrane 170. In some embodiments, the second portion 153 is elevated relative to the roofing membrane 170. In an embodiment, the first surface 141 of at least the first portion 151 is attached to the roofing membrane 170. In some embodiments, a second portion 153 of the rounded end 149 is elevated relative to the roofing membrane 170, such that the photovoltaic module 110 is sloped at an angle A relative to the roofing membrane 170. In some embodiments, the angle A is 0.1 degrees to 15 degrees. In some embodiments, the angle A is 0.1 degrees to 10 degrees. In some embodiments, the angle A is 0.1 degrees to 5 degrees. In some embodiments, the angle A is 5 degrees to 15 degrees. In some embodiments, the angle A is 5 degrees to 10 degrees. In some embodiments, the angle A is 10 degrees to 15 degrees. In some embodiments, the angle A is 5 degrees. In some embodiments, the angle A is 10 degrees. In some embodiments, the angle A is 15 degrees. In some embodiments, the angle A is 0.1 degree. In some embodiments, the angle A is 0 degrees. In some embodiments, at least a portion of the second surface 147 of the bottom flap 144 is attached to the roofing membrane 170. In some embodiments, the photovoltaic module 110 is configured to be a watershedding layer of the roofing system. In some embodiments, the slope of the photovoltaic module 110 prevents water pooling thereon. In some embodiments, the first surface 141 of the head flap 140 includes indicia representing markings of the locations to attach the head flap 140 to the roofing membrane 170 to obtain the corresponding angle A. In some embodiments, the rounded end 149 includes a radius of curvature R.

In some embodiments, a space 155 is formed between the first portion 151 of the rounded end 149 and the second portion 153 of the rounded end 149. In some embodiments, a junction box 156 is attached to the second surface 143 of the head flap 140. In some embodiments, the junction box 156 is attached to the first surface 141 of the head flap 140. In some embodiments, the junction box 156 is located within the space 155. In some embodiments, the second portion 153 is perforated. In some embodiments, the second portion 153 includes perforations that are configured to release air within the space 155, due to wind or otherwise, and prevent the first portion 151 from being detached from the roofing membrane 170. In some embodiments, the rounded end 149 is configured to be flexible and collapsible for walkability. In some embodiments, the space 155 is sized and shaped to enable the rounded end 149 to be collapsible.

Figure 8A:
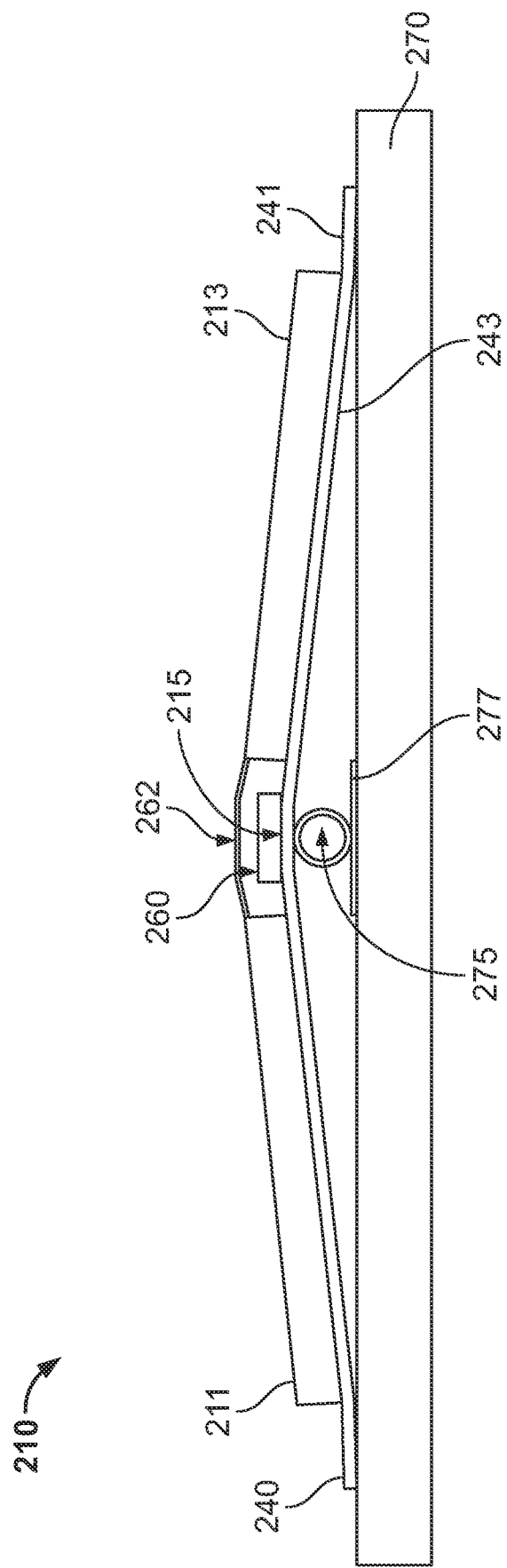
FIGS. 8A through 8E illustrate some embodiments of a photovoltaic module.
Figure 8B:
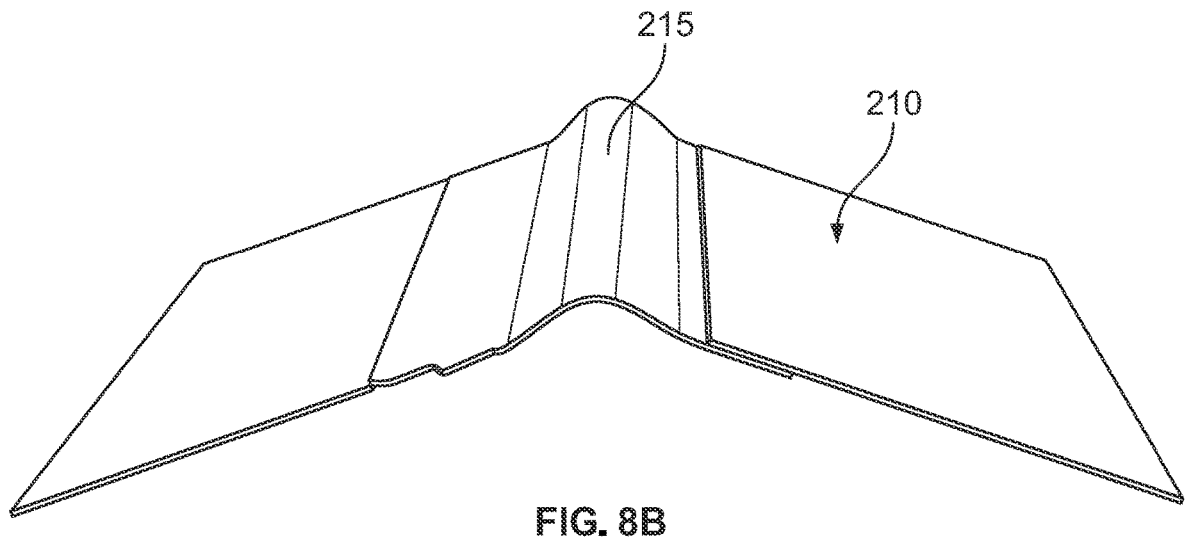
Figure 8C:
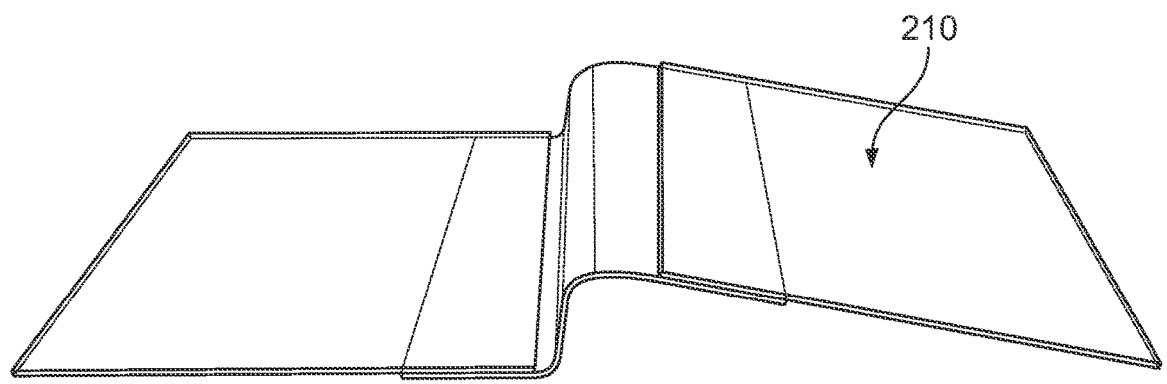
Figure 8D:
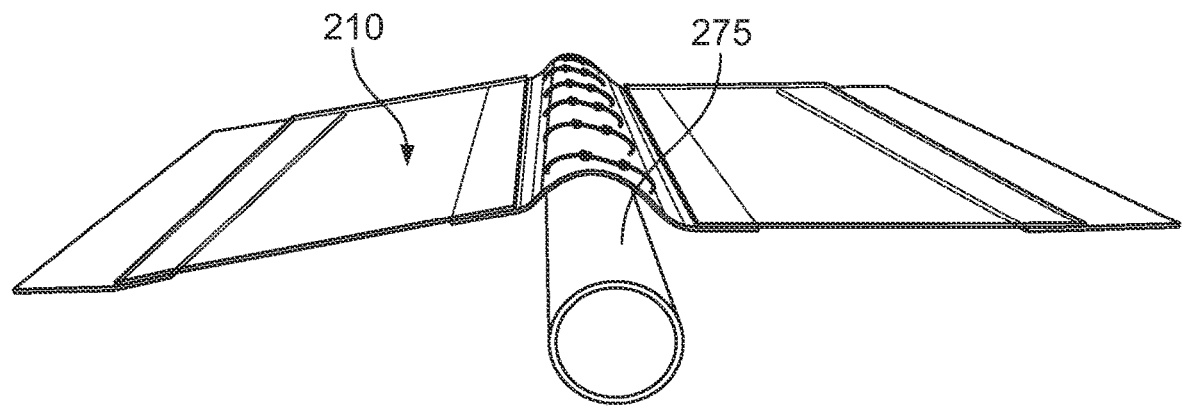
Figure 8E:
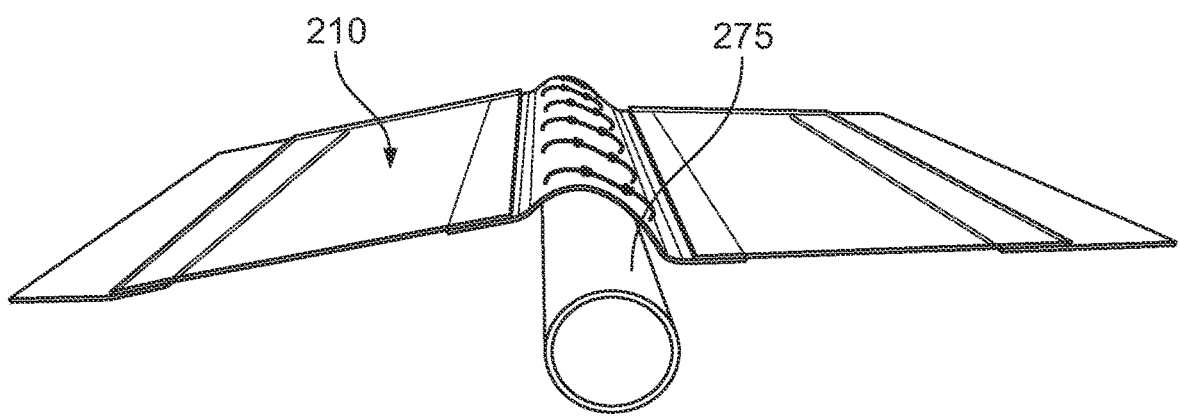
Figure 9:
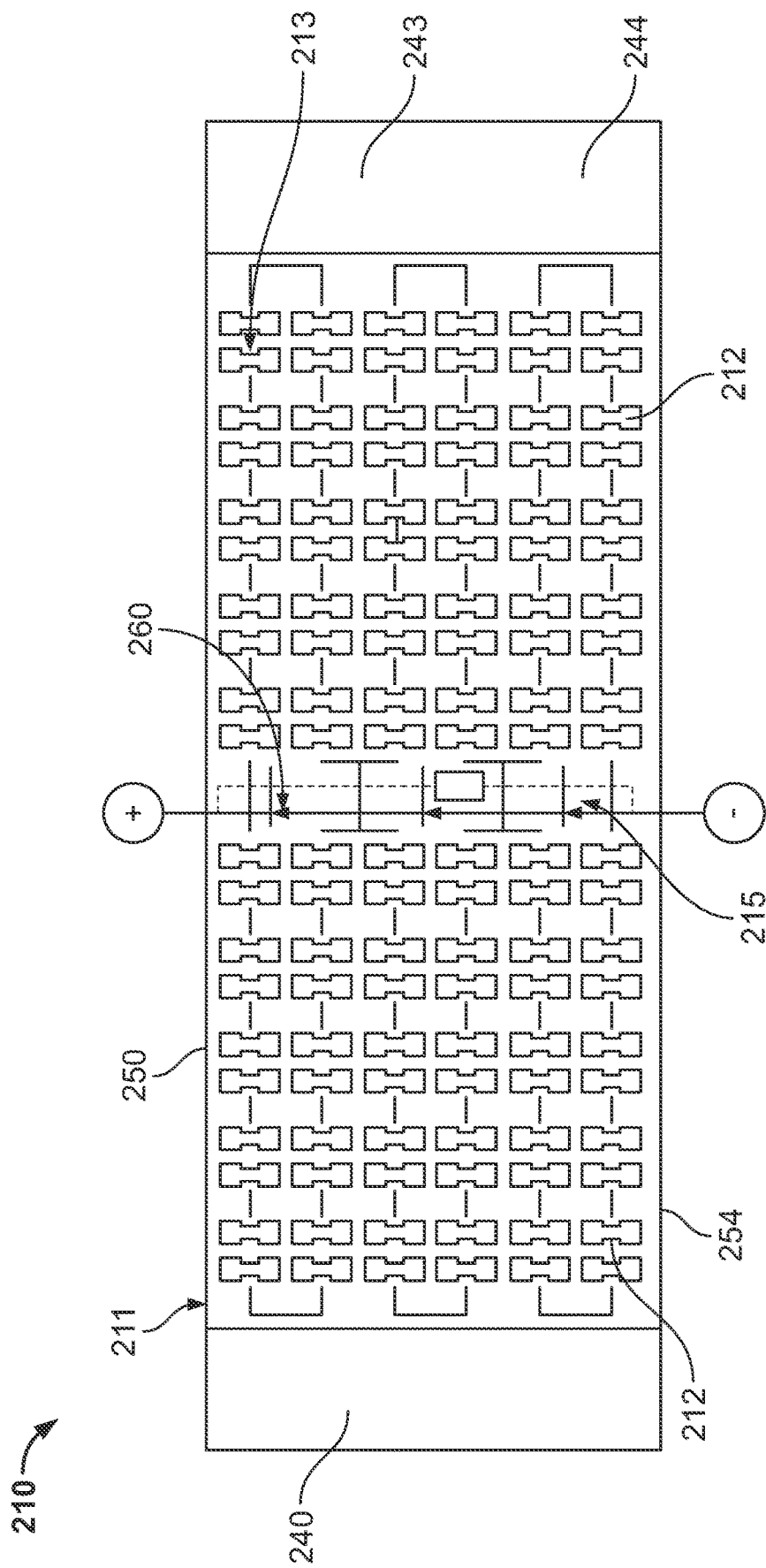
FIG. 9 is a top plan view of some embodiments of a photovoltaic module.

FIGS. 8A through 9 show an embodiment of a photovoltaic module 210. In some embodiments, the photovoltaic module 210 includes a structure and function similar to those of the photovoltaic module 10, except for certain differences provided herein. In some embodiments, the photovoltaic module 210 includes a first portion 211, a second portion 213, and a region 215 located intermediate the first portion 211 and the second portion 213. In some embodiment, the first portion 211 includes a first array of a plurality of solar cells 212 and the second portion 213 includes a second array of the plurality of solar cells 212. In some embodiments, the region 215 extends from a first side 250 of the photovoltaic module 210 to a second side 254 of the photovoltaic module 210 opposite the first side 250. In some embodiments, the region 215 is centrally-located. In some embodiments, the region 215 does not include any of the plurality of solar cells 212. In some embodiments, the region 215 includes a reinforcing layer. In some embodiments, at least one electrical component 260 is located on a first surface 241 of the photovoltaic module 210 and within the region 215. In some embodiments, at least one electrical component 260 is laminated within the photovoltaic module 210 and in the region 215. In some embodiments, the at least one electrical component 260 includes a junction box. In some embodiments, the at least one electrical component 260 includes a diode. In some embodiments, the at least one electrical component 260 includes a module level power electronic component. In some embodiments, the at least one electrical component 260 includes an optimizer. In some embodiments, the at least one electrical component 260 includes an electrical connector. In some embodiments, the photovoltaic module 210 includes a cover 262 that covers the at least one electrical component 260. In some embodiments, the cover 262 covers the region 215.

In some embodiments, the cover 262 is composed of polyvinyl chloride. In some embodiments, the cover 262 is flexible. In some embodiments, the cover 262 is elastic. In some embodiments, the cover 262 is rigid.

In some embodiments, the first portion 211 of the photovoltaic module 210 includes a head flap 240. In some embodiments, the head flap 240 is located proximate to the first array of the plurality of solar cells 212. In some embodiments, the second portion 213 of the photovoltaic module 210 includes a bottom flap 244. In some embodiments, the bottom flap 244 is located proximate to the second array of the plurality of solar cells 212.

In some embodiments, the photovoltaic module 210 is attached to a roofing membrane 270 of a roofing system. In some embodiments, at least a portion of the head flap 240 is attached to the roofing membrane 270. In some embodiments, at least a portion of the bottom flap 244 is attached to the roofing membrane 270. In some embodiments, a support member 275 is positioned intermediate the roofing membrane 270 and a second surface 243 of the photovoltaic module 210. In some embodiments, the support member 275 is located beneath the region 215. In some embodiments, the support member 275 includes a rod. In some embodiments, the support member 275 includes a tubular rod. In an embodiment, the tubular rod is configured to receive electrical wire. In some embodiments, the support member 275 includes a cylindrical-shaped cross-section. In some embodiments, the support member 275 is square-shaped cross-section. In some embodiments, the support member 275 is rectangular-shaped cross-section. In some embodiments, the support member 275 includes a triangular-shaped cross-section. In some embodiments, the support member 275 includes an elliptical-shaped cross-section. In some embodiments, the support member 275 includes a U-shaped cross-section. In some embodiments, the support member 275 includes a base 277. In some embodiments, the base 277 is flat. In some embodiments, the base 277 is attached to the roofing membrane 270.

In some embodiments, the support member 275 is composed of a polymeric material. In some embodiments, In some embodiments, the support member 275 is composed of polyethylene terephthalate ("PET"). In some embodiments, the support member 275 is composed of ethylene tetrafluoroethylene ("ETFE"). In some embodiments, the support member 275 is composed of an acrylic such as polymethyl methacrylate ("PMMA"). In some embodiments, the support member 275 is composed of thermoplastic polyolefin (TPO). In some embodiments, the support member 275 is composed of polyvinyl chloride. In some embodiments, the support member 275 is composed of ethylene propylene diene monomer (EPDM) rubber. In some embodiments, the support member 275 is composed of metal. In some embodiments, the support member 275 is flexible. In some embodiments, the support member 275 is elastic. In some embodiments, the support member 275 is rigid.

In some embodiments, the support member 275 elevates at least a portion of the photovoltaic module 210 over the roofing membrane 270. In some embodiments, the support member 275 elevates the region 215 over the roofing membrane 270. In some embodiments, the support member 275 elevates at least a portion of the first portion 211 over the roofing membrane 270. In some embodiments, the support member 275 elevates at least a portion of the second portion 213 over the roofing membrane 270. In some embodiments, the first portion 211 is sloped at an angle A relative to the roofing membrane 270. In some embodiments, the angle A is 0.1 degrees to 15 degrees. In some embodiments, the angle A is 0.1 degrees to 10 degrees. In some embodiments, the angle A is 0.1 degrees to 5 degrees. In some embodiments, the angle A is 5 degrees to 15 degrees. In some embodiments, the angle A is 5 degrees to 10 degrees. In some embodiments, the angle A is 10 degrees to 15 degrees. In some embodiments, the angle A is 5 degrees. In some embodiments, the angle A is 10 degrees. In some embodiments, the angle A is 15 degrees.

In some embodiments, the second portion 213 is sloped at an angle B relative to the roofing membrane 270. In some embodiments, the angle B is 0.1 degrees to 15 degrees. In some embodiments, the angle B is 0.1 degrees to 10 degrees. In some embodiments, the angle B is 0.1 degrees to 5 degrees. In some embodiments, the angle B is 5 degrees to 15 degrees. In some embodiments, the angle B is 5 degrees to 10 degrees. In some embodiments, the angle B is 10 degrees to 15 degrees. In some embodiments, the angle B is 0.1 degree. In some embodiments, the angle B is 5 degrees. In some embodiments, the angle B is 10 degrees. In some embodiments, the angle B is 15 degrees. In some embodiments, the angle B is 0 degrees. In some embodiments, the angle A is equal to the angle B. In some embodiments, the angle A is substantially the same as the angle B. In some embodiments, the angle A is different from the angle B. In some embodiments, the slopes of the photovoltaic module 210 prevent water pooling thereon.

In some embodiments, the region 215 is configured to be flexible and stretchable. In some embodiments, the region 215 is configured to be flexed and stretched when the support member 275 is positioned intermediate the region 215 and the roofing membrane 270. In some embodiments, each of the first portion 211 and the second portion 213 is configured to be flexible and collapsible for walkability. Referring to FIGS. 8B through 8E, in some embodiments, the support member 275 is sized and shaped to enable the first portion 211 and the second portion 213 to be collapsible.

Figure 10:
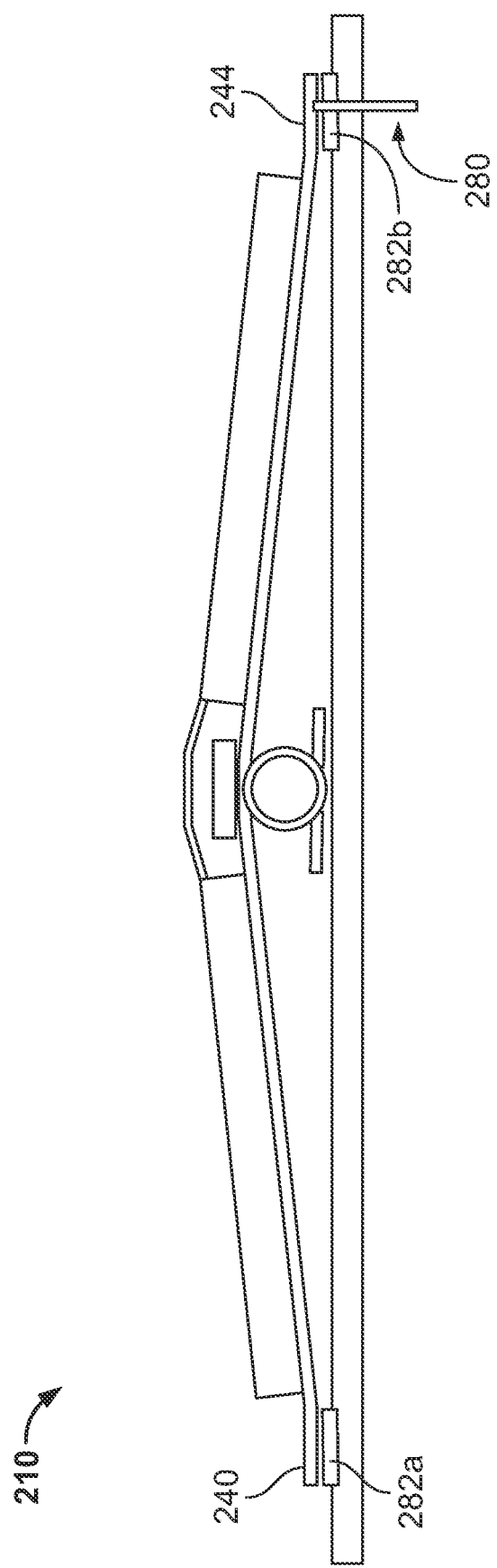
FIG. 10 is a side elevational view of some embodiments of a photovoltaic module.

In some embodiments, each of the head flap 240 and the bottom flap 244 is attached to the roofing membrane 270 by an adhesive. In some embodiments, each of the head flap 240 and the bottom flap 244 is attached to the roofing membrane 270 by thermal bonding. In some embodiments, each of the head flap 240 and the bottom flap 244 is attached to the roofing membrane 270 by ultrasonic welding. Referring to FIG. 10, in some embodiments, each of the head flap 240 and the bottom flap 244 is attached to the roofing membrane 270 by at least one fastener 280. In some embodiments, the at least one fastener 280 includes a plurality of the fasteners 280. In some embodiments, the at least one fastener 280 includes a nail. In some embodiments, the at least one fastener 280 includes a screw. In some embodiments, the at least one fastener 280 includes a rivet. In some embodiments, lower flaps 282a, 282b are positioned intermediate the head flap 240 and the roofing membrane 270 and the bottom flap 244 and the roofing membrane 270, respectively.

What is claimed is:

1. A system, comprising:
a roof deck,
wherein the roof deck includes a slope of 0.25 inch to 3 inches per foot,
wherein the roof deck includes a roofing membrane, and
wherein the roofing membrane is composed of a first material; and
at least one photovoltaic module installed on the roof deck, the photovoltaic module including
at least one solar cell
an encapsulant encapsulating the at least one solar cell, wherein the encapsulant includes a first surface and a second surface opposite the first surface,
a frontsheet juxtaposed with the first surface of the encapsulant, and
a backsheet juxtaposed with the second surface of the encapsulant,
wherein the backsheet includes
a head flap located at a first end of the backsheet, and
a bottom flap located at a second end of the backsheet opposite the first end,
wherein the backsheet is composed of the first material,
wherein at least a first portion of the head flap is attached to the roofing membrane, and
wherein at least a second portion of the bottom flap is attached to the roofing membrane.

2. The system of claim 1, wherein the first material is composed of a polymeric material.

3. The system of claim 1, wherein the first material is composed of thermoplastic polyolefin (TPO).

4. The system of claim 1, wherein the head flap and the bottom flap are attached to the roofing membrane by an adhesive.

5. The system of claim 1, wherein the head flap and the bottom flap are attached to the roofing membrane by thermal bonding.

6. The system of claim 1, wherein the head flap and the bottom flap are attached to the roofing membrane by ultrasonic welding.

7. The system of claim 1, wherein the backsheet includes a first side flap located at a first side of the photovoltaic module and a second side flap located at a second side of the photovoltaic module opposite the first side, wherein at least a third portion of the first side flap is attached to the roofing membrane and at least a fourth portion of the second side flap is attached to the roofing membrane.

8. The system of claim 1, wherein the backsheet includes a first surface and a second surface opposite the first surface of the backsheet, and wherein the first surface of the backsheet is juxtaposed with the second surface of the encapsulant.

9. The system of claim 1, wherein the second surface of the second portion of the bottom flap is attached to the roofing membrane.

10. The system of claim 9, wherein the second surface of the first portion of the head flap is attached to the roofing membrane.

11. The system of claim 9, wherein the first surface of the first portion of the head flap is attached to the roofing membrane.

12. The system of claim 11, wherein the head flap includes a free end, wherein the free end of the head flap is folded relative to itself and forms a rounded end.

13. The system of claim 12, wherein the rounded end includes a first portion juxtaposed with the roofing membrane and a second portion relative to the roofing membrane, wherein the second portion of the rounded end is elevated relative to the roofing membrane.

14. The system of claim 13, wherein the first surface of at least the first portion of the rounded end is attached to the roofing membrane.

15. The system of claim 13, wherein the second portion of the rounded end is sloped 0.1 degrees to 15 degrees.

16. The system of claim 1, further comprising at least one support member located intermediate a corresponding one of the at least one photovoltaic module and the roofing membrane, and wherein a portion of the at least one photovoltaic module is elevated relative to the roofing membrane.

17. The system of claim 16, wherein
the at least one solar cell includes
a first plurality of solar cells arranged in a first array, and
a second plurality of solar cells arranged in a second array,
wherein the at least one photovoltaic module includes
a first section,
a second section, and
a region located intermediate the first section and the second section,
wherein the first array is located within the first section,
wherein the second array is located within the second section,
wherein the at least one support member is juxtaposed with the region.

18. The system of claim 17, wherein the at least one support member includes a rod.

19. The system of claim 18, wherein the at least one support member is composed of thermoplastic polyolefin (TPO).

20. The system of claim 17, wherein each of the first section and the second section is elevated relative to the roofing membrane, wherein the first section is sloped 0.1 degrees to 15 degrees, and wherein the second section is sloped 0.1 degrees to 15 degrees.

* * * * *